(12) United States Patent
White et al.

(10) Patent No.: US 10,872,804 B2
(45) Date of Patent: *Dec. 22, 2020

(54) APPARATUS AND METHODS FOR ISOLATING A REACTION CHAMBER FROM A LOADING CHAMBER RESULTING IN REDUCED CONTAMINATION

(71) Applicant: ASM IP HOLDING B.V., Almere (NL)

(72) Inventors: Carl Louis White, Gilbert, AZ (US); Kyle Fondurulia, Phoenix, AZ (US); John Kevin Shugrue, Phoenix, AZ (US); David Marquardt, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 12 days.

This patent is subject to a terminal disclaimer.

(21) Appl. No.: 16/031,613

(22) Filed: Jul. 10, 2018

(65) Prior Publication Data
US 2019/0139808 A1 May 9, 2019

Related U.S. Application Data

(63) Continuation-in-part of application No. 15/803,615, filed on Nov. 3, 2017.

(51) Int. Cl.
*H01L 21/687* (2006.01)
*C23C 16/458* (2006.01)
(Continued)

(52) U.S. Cl.
CPC .... *H01L 21/68735* (2013.01); *C23C 16/4412* (2013.01); *C23C 16/458* (2013.01);
(Continued)

(58) Field of Classification Search
None
See application file for complete search history.

(56) References Cited

U.S. PATENT DOCUMENTS 4,270,999 A 6/1981 Hassan et al.
4,533,410 A 8/1985 Ogura et al.
(Continued)

FOREIGN PATENT DOCUMENTS

JP 1992-100222 4/1992
JP 1992-118925 4/1992
(Continued)

OTHER PUBLICATIONS

English Translation of Notice of Reasons for Rejection dated Aug. 29, 2011 for Japanese Patent Application No. 2007-551472.
(Continued)

*Primary Examiner* — Karla A Moore
(74) *Attorney, Agent, or Firm* — Knobbe, Martens, Olson & Bear, LLP

(57) ABSTRACT

The present disclosure relates to a semiconductor processing apparatus having a reaction chamber which can include a baseplate having an opening; a moveable substrate support configured to support a substrate; a movement element configured to move a substrate held on the substrate support towards the opening of the baseplate; a plurality of gas inlets positioned above and configured to direct gas downwardly towards the substrate support; and a sealing element configured to form a seal between the baseplate and the substrate support, the seal positioned at a greater radial distance from a center of the substrate support than an outer edge of the substrate support. In some embodiments, the sealing element can also include a plurality of apertures extend through the sealing element, the apertures configured to provide a flow path between a position below the sealing element to a position above the sealing element. Some embodiments include two or more stacked sealing elements.

28 Claims, 13 Drawing Sheets

(51) Int. Cl.
*C23C 16/455* (2006.01)
*C23C 16/44* (2006.01)
*H01L 21/67* (2006.01)

(52) U.S. Cl.
CPC .. *C23C 16/45544* (2013.01); *C23C 16/45565* (2013.01); *H01L 21/6719* (2013.01); *H01L 21/67126* (2013.01); *H01L 21/68764* (2013.01)

(56) References Cited

U.S. PATENT DOCUMENTS

| | | |
|---|---|---|
| 4,560,420 A | 12/1985 | Lord |
| 4,589,369 A | 5/1986 | Mahler |
| 4,761,269 A | 8/1988 | Conger et al. |
| 4,828,224 A | 5/1989 | Crabb et al. |
| 4,889,609 A | 12/1989 | Cannella |
| 4,978,567 A | 12/1990 | Miller |
| 4,986,215 A | 1/1991 | Yamada et al. |
| 5,024,748 A | 6/1991 | Fujimura |
| 5,077,875 A | 1/1992 | Hoke et al. |
| 5,186,718 A | 2/1993 | Tepman et al. |
| 5,188,501 A | 2/1993 | Tomita et al. |
| 5,198,034 A | 3/1993 | DeBoer et al. |
| 5,242,501 A | 9/1993 | McDiarmid |
| 5,286,296 A | 2/1994 | Sato et al. |
| 5,322,079 A | 6/1994 | Fukutomi et al. |
| 5,370,738 A | 12/1994 | Watanabe et al. |
| 5,403,401 A | 4/1995 | Haafkens et al. |
| 5,427,620 A | 6/1995 | DeBoer et al. |
| 5,435,682 A | 7/1995 | Crabb et al. |
| 5,514,439 A | 5/1996 | Sibley |
| 5,532,190 A | 7/1996 | Goodyear et al. |
| 5,586,585 A | 12/1996 | Bonora et al. |
| 5,588,827 A | 12/1996 | Muka |
| 5,601,686 A | 2/1997 | Kawamura et al. |
| 5,609,689 A | 3/1997 | Kato et al. |
| 5,611,655 A | 3/1997 | Fukasawa et al. |
| 5,647,945 A | 7/1997 | Matsuse et al. |
| 5,651,670 A | 7/1997 | Okase et al. |
| 5,651,868 A | 7/1997 | Canady et al. |
| 5,683,518 A | 11/1997 | Moore et al. |
| 5,690,742 A | 11/1997 | Ogata et al. |
| 5,730,801 A | 3/1998 | Tepman et al. |
| 5,746,875 A | 5/1998 | Maydan et al. |
| 5,761,023 A | 6/1998 | Lue et al. |
| 5,784,799 A | 7/1998 | Kato et al. |
| 5,785,796 A | 7/1998 | Lee |
| 5,788,778 A | 8/1998 | Shang et al. |
| 5,800,622 A | 9/1998 | Takemi et al. |
| 5,803,977 A | 9/1998 | Tepman et al. |
| 5,810,942 A | 9/1998 | Narayanswami et al. |
| 5,820,692 A | 10/1998 | Baecker et al. |
| 5,844,195 A | 12/1998 | Fairbairn et al. |
| 5,853,214 A | 12/1998 | Babbs et al. |
| 5,879,574 A | 3/1999 | Sivaramakrishnan et al. |
| 5,887,117 A | 3/1999 | Desu et al. |
| 5,913,978 A | 6/1999 | Kato et al. |
| 5,934,856 A | 8/1999 | Asakawa et al. |
| 5,935,490 A | 8/1999 | Archbold et al. |
| 5,981,399 A | 11/1999 | Kawamura et al. |
| 5,997,588 A | 12/1999 | Goodwin et al. |
| 6,001,183 A | 12/1999 | Guray et al. |
| 6,001,267 A | 12/1999 | Os et al. |
| 6,002,108 A | 12/1999 | Yoshioka |
| 6,042,623 A | 3/2000 | Edwards |
| 6,048,154 A | 4/2000 | Wytman |
| 6,093,252 A | 7/2000 | Wengert et al. |
| 6,106,634 A | 8/2000 | Ghanayem et al. |
| 6,113,702 A | 9/2000 | Halpin et al. |
| 6,113,984 A | 9/2000 | MacLeish et al. |
| 6,156,151 A | 12/2000 | Komino et al. |
| 6,158,946 A | 12/2000 | Miyashita |
| 6,203,622 B1 | 3/2001 | Halpin et al. |
| 6,214,116 B1 | 4/2001 | Shin |
| 6,224,312 B1 | 5/2001 | Sundar |
| 6,224,679 B1 | 5/2001 | Sasaki et al. |
| 6,245,152 B1 | 6/2001 | Imai et al. |
| 6,264,467 B1 | 7/2001 | Lue et al. |
| 6,286,230 B1 | 9/2001 | White et al. |
| 6,302,965 B1 | 10/2001 | Umotoy et al. |
| 6,306,216 B1 | 10/2001 | Kim et al. |
| 6,312,525 B1 | 11/2001 | Bright et al. |
| 6,394,797 B1 | 5/2002 | Sugaya et al. |
| 6,409,837 B1 | 6/2002 | Hillman |
| 6,415,736 B1 | 7/2002 | Hao et al. |
| 6,488,778 B1 | 12/2002 | Ballantine et al. |
| 6,536,136 B2 | 3/2003 | Saga |
| 6,539,891 B1 | 4/2003 | Lee et al. |
| 6,562,140 B1 | 5/2003 | Bondestam et al. |
| 6,630,201 B2 | 10/2003 | Chiang et al. |
| 6,634,882 B2 | 10/2003 | Goodman |
| 6,666,921 B2 | 12/2003 | Sakai et al. |
| 6,729,875 B2 | 5/2004 | Goodman |
| 6,820,570 B2 | 11/2004 | Kilpela et al. |
| 6,828,235 B2 | 12/2004 | Takano |
| 6,840,767 B2 | 1/2005 | Goodman |
| 6,875,280 B2 | 4/2005 | Ikeda et al. |
| 6,899,507 B2 | 5/2005 | Yamagishi et al. |
| 6,916,398 B2 | 7/2005 | Chen et al. |
| 7,017,514 B1 | 3/2006 | Shepherd, Jr. et al. |
| 7,021,881 B2 | 4/2006 | Yamagishi et al. |
| 7,022,613 B2 | 4/2006 | Pomarede et al. |
| 7,138,336 B2 | 11/2006 | Lee et al. |
| 7,163,587 B2 | 1/2007 | Kinnard et al. |
| 7,175,713 B2 | 2/2007 | Thakur et al. |
| 7,228,873 B2 | 6/2007 | Ku et al. |
| 7,252,716 B2 | 8/2007 | Kim et al. |
| 7,264,846 B2 | 9/2007 | Chang et al. |
| 7,276,123 B2 | 10/2007 | Shimizu et al. |
| 7,387,686 B2 | 6/2008 | Iwamoto et al. |
| 7,422,636 B2 | 9/2008 | Ishizaka |
| 7,582,181 B2 | 9/2009 | Babic |
| 7,608,549 B2 | 10/2009 | Van Nooten et al. |
| 7,648,578 B1 | 1/2010 | Itatani et al. |
| 7,682,454 B2 | 3/2010 | Sneh |
| 7,669,932 B1 | 4/2010 | Miller |
| 7,794,546 B2 | 9/2010 | Li |
| 7,845,309 B2 | 12/2010 | Condrashoff et al. |
| 7,976,898 B2 | 7/2011 | Hong et al. |
| 7,993,457 B1 | 8/2011 | Krotov et al. |
| 8,152,922 B2 | 4/2012 | Schmidt et al. |
| 8,211,230 B2 | 7/2012 | Verghese et al. |
| 8,216,380 B2 | 7/2012 | White et al. |
| 8,282,735 B2 | 10/2012 | Choi et al. |
| 8,287,648 B2 | 10/2012 | Reed et al. |
| 8,759,226 B2 | 6/2014 | Reed et al. |
| 9,359,672 B2 | 6/2016 | Verghese et al. |
| 10,468,291 B2 | 11/2019 | Verghese et al. |
| 2001/0000759 A1 | 5/2001 | Doley et al. |
| 2001/0035132 A1 | 11/2001 | Kent et al. |
| 2001/0042514 A1 | 11/2001 | Mizuno et al. |
| 2002/0020344 A1 | 2/2002 | Takano |
| 2003/0019428 A1 | 1/2003 | Ku et al. |
| 2003/0079686 A1 | 5/2003 | Chen et al. |
| 2003/0082301 A1 | 5/2003 | Chen et al. |
| 2003/0082307 A1 | 5/2003 | Chung et al. |
| 2003/0106490 A1 | 6/2003 | Jallepally et al. |
| 2003/0108674 A1 | 6/2003 | Chung et al. |
| 2003/0121608 A1 | 7/2003 | Chen et al. |
| 2003/0124262 A1 | 7/2003 | Chen et al. |
| 2003/0129308 A1 | 7/2003 | Chen et al. |
| 2003/0150560 A1 | 8/2003 | Kinnard et al. |
| 2003/0198741 A1 | 10/2003 | Uchida et al. |
| 2003/0203616 A1 | 10/2003 | Chung et al. |
| 2003/0230322 A1 | 12/2003 | Hillman et al. |
| 2004/0009336 A1 | 1/2004 | Marcadal et al. |
| 2004/0009665 A1 | 1/2004 | Chen et al. |
| 2004/0048461 A1 | 3/2004 | Chen et al. |
| 2004/0069227 A1 | 4/2004 | Ku et al. |
| 2004/0077183 A1 | 4/2004 | Chung |
| 2004/0099378 A1 | 5/2004 | Kim et al. |
| 2004/0144311 A1 | 7/2004 | Chen et al. |
| 2004/0144400 A1 | 7/2004 | Satoh et al. |

(56) References Cited

U.S. PATENT DOCUMENTS

| | | |
|---|---|---|
| 2004/0166697 A1 | 8/2004 | Wang et al. |
| 2004/0187304 A1 | 9/2004 | Chen et al. |
| 2004/0221807 A1 | 11/2004 | Verghese et al. |
| 2004/0221808 A1 | 11/2004 | Kawano |
| 2004/0231799 A1 | 11/2004 | Lee et al. |
| 2004/0241321 A1 | 12/2004 | Ganguli et al. |
| 2004/0255985 A1 | 12/2004 | Xia et al. |
| 2004/0256351 A1 | 12/2004 | Chung et al. |
| 2004/0266175 A1 | 12/2004 | Chen et al. |
| 2005/0000449 A1 | 1/2005 | Ishibashi et al. |
| 2005/0009325 A1 | 1/2005 | Chung et al. |
| 2005/0011555 A1 | 1/2005 | Maula et al. |
| 2005/0022737 A1 | 2/2005 | Shimizu et al. |
| 2005/0054196 A1 | 3/2005 | Wu et al. |
| 2005/0268856 A1 | 12/2005 | Miller et al. |
| 2006/0065636 A1 | 3/2006 | Babic |
| 2006/0105548 A1 | 5/2006 | Kudo et al. |
| 2006/0107970 A1 | 5/2006 | Verhaverbeke |
| 2006/0130761 A1 | 6/2006 | Sakai |
| 2006/0180082 A1 | 8/2006 | Iwamoto et al. |
| 2006/0249077 A1 | 11/2006 | Kim et al. |
| 2008/0090415 A1* | 4/2008 | Maeda ................ C23C 16/4404 438/680 |
| 2009/0136665 A1 | 5/2009 | Choi et al. |
| 2010/0202860 A1* | 8/2010 | Reed ................. H01L 21/68742 414/221 |
| 2013/0129577 A1* | 5/2013 | Halpin .................. B01J 8/0035 422/236 |
| 2016/0233124 A1 | 8/2016 | Verghese et al. |
| 2019/0139807 A1* | 5/2019 | White ................ C23C 16/4409 |
| 2019/0139808 A1 | 5/2019 | White et al. |

FOREIGN PATENT DOCUMENTS

| | | |
|---|---|---|
| JP | 05-275519 | 10/1993 |
| JP | 07018438 | 1/1995 |
| JP | 07-142391 | 6/1995 |
| JP | 1995-211761 | 8/1995 |
| JP | 07-273092 | 10/1995 |
| JP | 07-283147 | 10/1995 |
| JP | 08148541 | 6/1996 |
| JP | 1998-270527 | 10/1998 |
| JP | 1999-288992 | 10/1999 |
| JP | 11-330064 | 11/1999 |
| JP | 2000315720 | 11/2000 |
| JP | 2003-059997 | 2/2003 |
| JP | 2003-508932 | 3/2003 |
| JP | 2004-91848 | 3/2004 |
| JP | 2004-538374 | 12/2004 |
| KR | 0319494 | 1/2002 |
| KR | 2004-63893 | 7/2004 |
| TW | 201034107 A | 9/2010 |
| TW | 201341585 A | 10/2013 |
| WO | WO 01/04935 | 1/2001 |
| WO | WO 01/17692 | 3/2001 |
| WO | WO 03/016587 | 2/2003 |
| WO | WO 03/030243 | 4/2003 |
| WO | WO 2004/025716 | 3/2004 |

OTHER PUBLICATIONS

English translation of the Office Action in Japanese Patent Application No. 2011-265435, Filed Jan. 17, 2006, dated Dec. 4, 2012.
English translation of the Office Action in Korean Patent Application No. 10-2007-7018502, Filed Jan. 17, 2006, dated Nov. 19, 2012.
English translation of the Office Action in Taiwan Patent Application No. 95101879, filed Jan. 18, 2006, dated Oct. 26, 2012.
European Office Action dated May 4, 2007 in counterpart European Patent Application No. 03 731 267.8.
International Search Report for Application No. PCT/US2006/001640 (the PCT counterpart of the parent application) dated Jun. 19, 2006.
Japanese Office Action dated Mar. 25, 2009 in counterpart Japanese Patent Application No. 2004-508393.
Mason et al., "Influence of gas mixing and expansion in horizontal MOVPE reactors". Journal of Crystal Growth. vol. 107, No. 1 / 4, Jan. 1991, pp. 181-187.
Office Action in Japanese Patent Application No. 2011-265435, dated Apr. 16, 2013, filed Jan. 17, 2006.
Office Action in Japanese Patent Application No. 2011-265435, filed Jan. 17, 2006, dated Sep. 24, 2013.
Office Action in Korean Patent Application No. 10-2013-7004189, dated Feb. 18, 2014, filed Feb. 19, 2013.
Office Action in Korean Patent Application No. 2013-7004189, filed Feb. 19, 2013, dated Nov. 14, 2013.
Office Action in Korean Patent Application No. 10-2013-7004189, dated Apr. 24, 2013, filed Feb. 19, 2013.
Taiwanese Search Report dated Oct. 28, 2020, TW in counterpart Application No. 107138406.
Taiwanese Office Action dated Oct. 28, 2020, TW in counterpart Application No. 107138406.

* cited by examiner

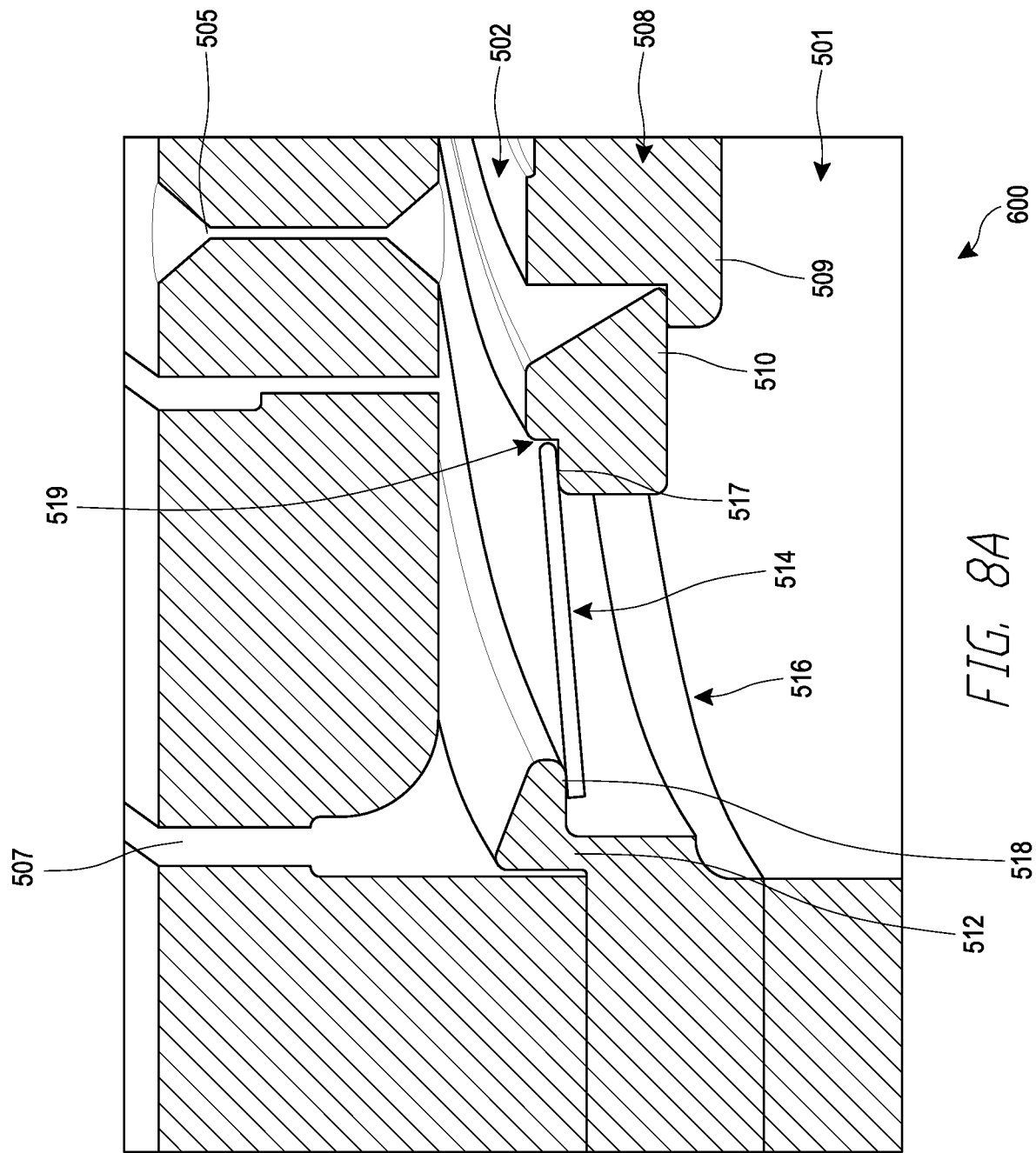

APPARATUS AND METHODS FOR ISOLATING A REACTION CHAMBER FROM A LOADING CHAMBER RESULTING IN REDUCED CONTAMINATION

BACKGROUND

Field of the Disclosure

The present disclosure relates to systems and methods for handling and processing semiconductor substrates and, in particular, to reactors used for the fabrication of thin films.

Description of the Related Art

In the processing of semiconductor devices, such as transistors, diodes, and integrated circuits, a plurality of such devices are typically fabricated simultaneously on a thin slice of semiconductor material, termed a substrate, wafer, or workpiece. The fabrication process includes, among other steps, vapor deposition for depositing thin films on surfaces of substrates. These methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Deposition (ALD).

In an ALD process, one or more substrates with at least one surface to be coated are introduced into a deposition chamber. The substrate is heated to a desired temperature, typically above the condensation temperatures of the selected vapor phase reactants and below their thermal decomposition temperatures. One reactant is capable of reacting with the adsorbed species of a prior reactant to form a desired product on the substrate surface. Two, three or more reactants are provided to the substrate, typically in spatially and temporally separated pulses.

In an example, in a first pulse, a first reactant representing a precursor material is adsorbed largely intact in a self-limiting process on a wafer. The process is self-limiting because the vapor phase precursor cannot react with or adsorb upon the adsorbed portion of the precursor. After any remaining first reactant is removed from the wafer or chamber, the adsorbed precursor material on the substrate reacted with a subsequent reactant pulse to form no more than a single molecular layer of the desired material. The subsequent reactant may, e.g., strip ligands from the adsorbed precursor material to make the surface reactive again, replace ligands and leave additional material for a compound, etc. In an unadulterated ALD process, less than a monolayer is formed per cycle on average due to steric hindrance, whereby the size of the precursor molecules prevent access to adsorption sites on the substrate, which may become available in subsequent cycles. Thicker films are produced through repeated growth cycles until the target thickness is achieved. Growth rate is often provided in terms of angstroms per cycle because in theory the growth depends solely on number of cycles, and has no dependence upon mass supplied or temperature, as long as each pulse is saturative and the temperature is within the ideal ALD temperature window for those reactants (no thermal decomposition and no condensation).

Reactants and temperatures are typically selected to avoid both condensation and thermal decomposition of the reactants during the process, such that chemical reaction is responsible for growth through multiple cycles. However, in certain variations on ALD processing, conditions can be selected to vary growth rates per cycle, possibly beyond one molecular monolayer per cycle, by utilizing hybrid CVD and ALD reaction mechanisms. Other variations maybe allow some amount of spatial and/or temporal overlap between the reactants. In ALD and variations thereof, two, three, four or more reactants can be supplied in sequence in a single cycle, and the content of each cycle can be varied to tailor composition.

During a typical ALD process, the reactant pulses, all of which are in vapor form, are pulsed sequentially into a reaction space (e.g., reaction chamber) with removal steps between reactant pulses to avoid direct interaction between reactants in the vapor phase. For example, inert gas pulses or "purge" pulses can be provided between the pulses of reactants. The inert gas purges the chamber of one reactant pulse before the next reactant pulse to avoid gas phase mixing. To obtain a self-limiting growth, a sufficient amount of each precursor is provided to saturate the substrate. As the growth rate in each cycle of a true ALD process is self-limiting, the rate of growth is proportional to the repetition rate of the reaction sequences rather than to the flux of reactant.

When implementing ALD or other deposition processes, it is desirable that the workpiece does not become contaminated by particulates, which may lead to device failure. Accordingly, reactors in which workpieces are processed are typically sealed to prevent contamination from the exterior of the reaction space from entering the reaction space and to prevent reactants and reactant byproducts from escaping to the exterior of the reaction space.

SUMMARY

According to one embodiment, a semiconductor processing apparatus is provided. The semiconductor processing apparatus comprises a reaction chamber comprising a baseplate including an opening, a moveable substrate support configured to support a substrate, a movement element configured to move a substrate held on the substrate support towards the opening of the baseplate, a plurality of gas inlets positioned above and configured to direct gas downwardly towards the substrate support, and a sealing element configured to form a seal between the baseplate and the substrate support, the seal positioned at a greater radial distance from a center of the substrate support than an outer edge of the substrate support.

According to certain embodiments, each aperture can comprise a slot, and the plurality of apertures can be spaced around an outer edge of the sealing element. The apparatus can further comprise a second plurality of slots arranged on a radially inner portion of the sealing element.

According to one embodiment, a semiconductor processing apparatus comprises a reaction chamber comprising a baseplate including an opening, a moveable substrate support configured to support a substrate, a movement element configured to move a substrate held on the substrate support towards the opening of the baseplate, and a metal sealing element extending around the substrate support and configured to form a seal between the baseplate and the substrate support. A plurality of apertures extend through the sealing element, the apertures configured to provide a flow path between a position below the sealing element to a position above the sealing element.

According to certain embodiments, each aperture can comprise a slot, and the plurality of apertures can be spaced around an outer edge of the sealing element. The apparatus can further comprise a second plurality of slots arranged on a radially inner portion of the sealing element.

According to one embodiment, a semiconductor processing apparatus comprises a reaction chamber comprising a baseplate including an opening, a moveable substrate support comprising a substrate retention portion configured to support a substrate, a movement element configured to move a substrate held on the substrate support towards the opening of the baseplate, and a sealing element configured to form a seal between the baseplate and the substrate support. The seal is positioned radially from a center of the substrate support at a distance at least 30% or greater than the distance between the center of the substrate support and an outer edge of the substrate retention portion. A plurality of apertures extend through the sealing element, the apertures configured to provide a flow path between a position below the sealing element to a position above the sealing element.

According to another embodiment, a semiconductor processing apparatus comprises a reaction chamber comprising a baseplate including an opening, a moveable substrate support configured to support a substrate, a movement element configured to move a substrate held on the substrate support towards the opening of the baseplate, and two or more stacked metal sealing elements. The stacked metal sealing elements extend around the substrate support. At least one of the metal sealing elements is configured to form a seal between the baseplate and the substrate support.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These and other features, aspects, and advantages of the invention disclosed herein are described below with reference to the drawings of some embodiments, which are intended to illustrate and not to limit the invention.

FIG. 8A is a cross-sectional view of an embodiment of a semiconductor processing apparatus.

DETAILED DESCRIPTION

Figure 1:
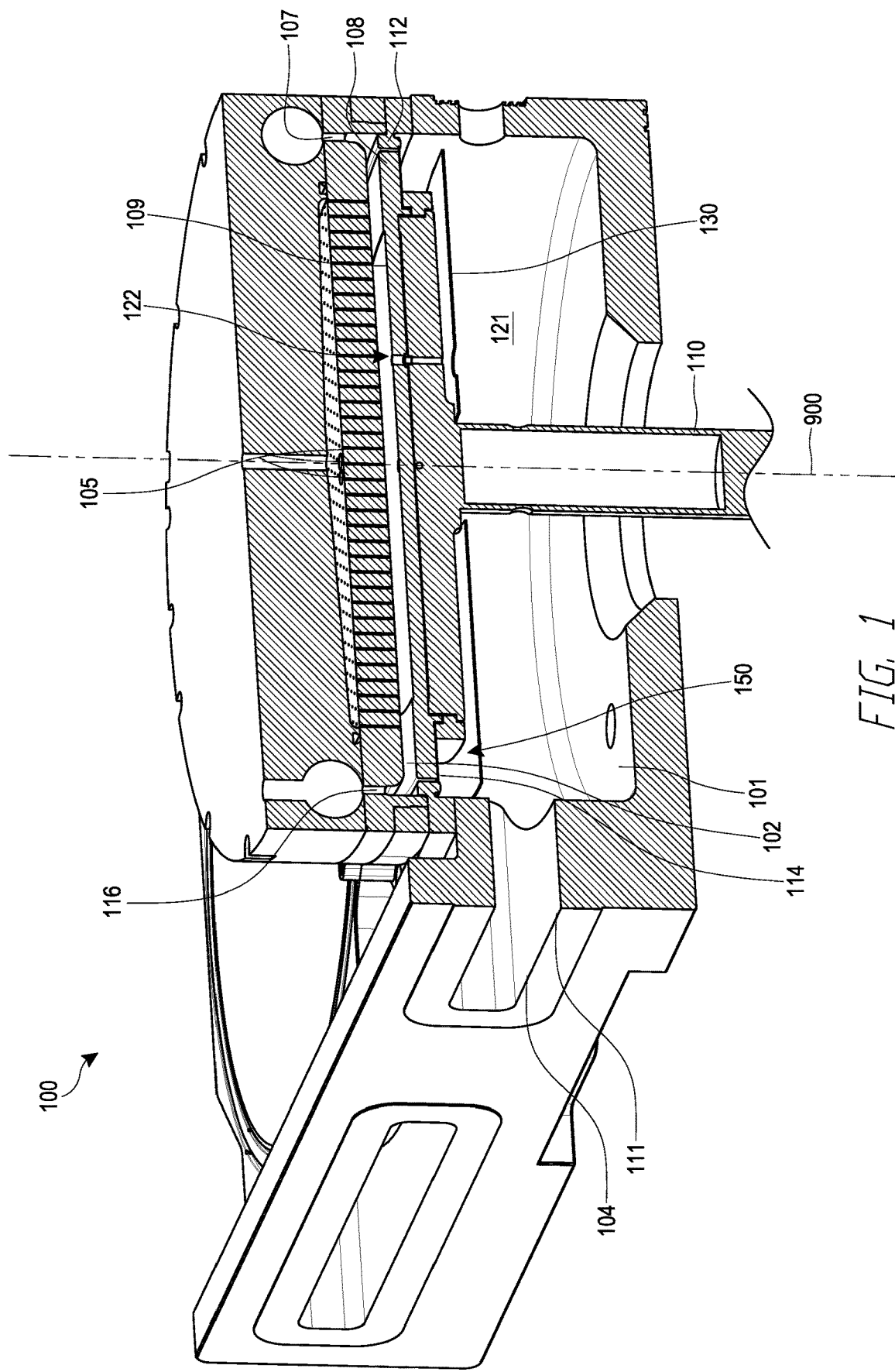
FIG. 1 is a perspective, cross-sectional view of an embodiment of a semiconductor processing apparatus.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention herein disclosed should not be limited by the particular disclosed embodiments described below.

In vapor or gas deposition processes, it can be important to provide uniform deposition across the width or major surface of the substrate (e.g., a semiconductor wafer). Uniform deposition ensures that deposited layers have the same thickness and/or chemical composition across the substrate, which improves the yield of integrated devices (e.g., processors, memory devices, etc.), and therefore the profitability per substrate. During such deposition processes, it can also be important to avoid exposure of the substrate and the reaction chamber from reaction byproducts, particulates, or other contaminants, to similarly improve yield and profitability.

The embodiments disclosed herein can be utilized with semiconductor processing devices configured for any suitable gas or vapor deposition process. For example, the illustrated embodiments show various systems for depositing material on a substrate using atomic layer deposition (ALD) techniques. Among vapor deposition techniques, ALD has many advantages, including high conformality at low temperatures and fine control of composition during the process. ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses. Removal can be accomplished by a variety of techniques, including purging and/or lowering pressure between pulses. Pulses can be sequential in a continuous flow, or the reactor can be isolated and can backfilled for each pulse.

Briefly, a substrate is loaded into a reaction chamber and is heated to a suitable deposition temperature, generally at lowered pressure. Deposition temperatures are typically maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved.

A first reactant is conducted into the chamber in the form of vapor phase pulse and contacted with the surface of a substrate. Conditions are preferably selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times for a single wafer reactor are from about 0.05 to 20 seconds, more preferably between about 1 and 10 seconds, and still more preferably between about 1 and 2 seconds. However, other purge times can be utilized if desired, such as when depositing layers over extremely high aspect ratio structures or other structures with complex surface morphology is needed, or when a high volume batch reactor is employed. The appropriate pulsing times can be readily determined by the skilled artisan based on the particular circumstances.

A second gaseous reactant is pulsed into the chamber where it reacts with the first reactant bound to the surface. Excess second reactant and gaseous by-products of the surface reaction are purged out of the reaction chamber, preferably with the aid of an inert gas. The steps of pulsing and purging are repeated until a thin film of the desired thickness has been formed on the substrate, with each cycle leaving no more than a molecular monolayer. Some ALD processes can have more complex sequences with three or more precursor pulses alternated, where each precursor contributes elements to the growing film. Reactants can also be supplied in their own pulses or with precursor pulses to strip or getter adhered ligands and/or free by-product, rather than contribute elements to the film. Additionally, not all cycles need to be identical. For example, a binary film can be doped with a third element by infrequent addition of a third reactant pulse, e.g., every fifth cycle, in order to control stoichiometry of the film, and the frequency can change during the deposition in order to grade film composition. Moreover, while described as starting with an adsorbing reactant, some recipes may start with the other reactant or with a separate surface treatment, for example to ensure maximal reaction sites to initiate the ALD reactions (e.g., for certain recipes, a water pulse can provide hydroxyl groups on the substrate to enhance reactivity for certain ALD precursors).

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size or steric hindrance restraints) and thus ensures excellent step coverage over any topography on the substrate. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed. While embodiments described herein are particularly advantageous for sequentially pulsed deposition techniques, like ALD and mixed-mode ALD/CVD, the embodiments herein can also be employed for pulsed or continuous CVD, or other semiconductor processes.

Examples of suitable reactors that may be used include commercially available ALD equipment such as any of the EmerALD®, Synergis®, or Eagle® series reactors, available from ASM International of Almere, the Netherlands. Many other kinds of reactors capable of ALD growth of thin films, including CVD reactors equipped with appropriate equipment and means for pulsing the precursors, can be employed. In some embodiments, a flow type ALD reactor is used, as compared to a backfilled reactor. For example, a plurality of inlets designed to evenly distribute gas into the reaction space may be implemented. For example, a dispersion mechanism such as a showerhead assembly may be implemented above a single-wafer reaction space.

The ALD processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated to the process temperature before each run. A stand-alone reactor can be equipped with a load-lock. In that case, it is not necessary to cool down the reaction space between each run. These processes can also be carried out in a reactor designed to process multiple substrates simultaneously, e.g., a mini-batch type showerhead reactor.

Some known semiconductor deposition apparatus designs include an upper processing chamber configured for horizontal reactant flow parallel to the surface of the wafer, and a lower loading chamber. A gap is configured between the two chambers configured to provide flow therethrough. The gap reduces inert gas purge flow from the lower chamber into the upper chamber, while also reducing diffusion of process byproducts from the reaction space into the lower chamber. However, these conventional designs are not effective for recent deposition processes which use increased gas flow rates. This is because the higher flow rates increase the pressure in the reaction chamber, and in turn, the loading chamber pressure is increased to prevent process chemistry from migrating into the lower chamber. The higher loading chamber pressure results in higher flow from the lower chamber into the process space, which further raises the process pressure and dilutes the process chemistry at the edge of the wafer, resulting in deposition non-uniformity and waste. Additionally, the existing inert gas purge path from the lower chamber into the upper chamber is very close to the wafer edge which can cause flow disturbances. These flow disturbances can in turn impact process deposition uniformity and/or generate particles. Soft seals, such as elastomeric O-rings that might be used for creating an isolating seal, cannot work at high process temperatures.

Described herein are embodiments of a sealing element that can be implemented to provide a seal between a process (e.g., upper) chamber and a loading (e.g., lower) chamber of a semiconductor processing apparatus. The sealing element can be configured such that when the process and loading chambers are moved to a processing position, a seal is formed between the two chambers. The sealing element is configured, for example, with apertures of a controlled size, shape, positioning and/or quantity, such that when the seal is formed, a controlled amount of gas can still flow between the two chambers. This configuration is different from the aforementioned conventional systems that do not have any sealing element, do not have direct sealing contact between the upper or lower chamber, and which maintain an unobstructed flow path via a gap between the two chambers.

Embodiments herein can provide a soft, flexible, contact seal to improve isolation of the loading chamber from the reaction chamber. The sealing element can provide a metal-to-metal contact seal providing controlled isolation between the two chambers. Although not a perfect seal, the embodiments can significantly reduce the flow from the lower chamber into the process space, and reduces diffusion from the process space into the lower chamber, improving process uniformity. The seal can be positioned further away radially from the edge of the substrate, relative to conventional processes, to also improve process uniformity and prevent contamination, for example, at the wafer edge. For example, the seal can be positioned proximate to the vacuum exhaust ports. Positioning the seal further from the edge of the substrate can also address concerns for particle generation that may occur at the seal contact area. A controlled flow of inert gas, via control of the configuration of the apertures in the sealing element, can provide a very low-flow purge to further reduce diffusion from the reaction chamber into the lower chamber. This purge flow can enter the reaction space at the outer edge of the reaction space (e.g., beyond the outer perimeter of the shower head) such that it does not disrupt the process gases close to the wafers edge, and thus does not affect process uniformity. The materials for the sealing element can be selected for compatibility with various process chemistries and temperatures. Examples of materials that can be used are hastelloy C22 and Grade 2 titanium. The sealing element can also be coated to further improve corrosion resistance (e.g. with Al2O3 deposited by ALD). Made of metal, the sealing element can handle high process temperatures (e.g. 680 C). The same hardware that is used to attach the sealing element to the perimeter of the substrate support can also be used to support a thermal isolation shield. The shield covers the underside of the susceptor support and heater to improve thermal uniformity.

FIG. 1 shows a perspective cross-sectional view of a semiconductor processing apparatus 100 comprising a loading chamber 101 and a reaction chamber 102, with a sealing element 114 positioned therebetween. Together, the loading chamber 101 and the reaction chamber 102 can be considered a process module. In the illustrated embodiment, the reaction chamber 101 is disposed above the loading chamber 102.

The reaction chamber 102 can comprise an inlet 105 and an outlet 107. The reaction chamber 102 can comprise a plurality of inlets 105. In some embodiments, the reaction chamber 102 can comprise a plurality of outlets 107. Gases such as reactants and purge gases can flow into the chamber 102 through the inlet 105. Outlet 107 can comprise an exhaust port to allow gases such as excess reactants, reactant byproducts, and purge gases to flow out of the chamber 102 through the outlet 107. The reaction chamber 102 can be configured as a single-wafer vertical flow reaction chamber. The reaction chamber can be configured as a gas or vapor deposition chamber, such as an ALD chamber.

The loading chamber 101 may comprise one or more inlets 104 and one or more outlets. In operation, gases such as purge gases may flow into the loading chamber 101 through the loading chamber inlet 104. The loading chamber outlet can comprise an exhaust port to allow gases such as excess reactants, reactant byproducts, and purge gases to flow out of the loading chamber 101. The reaction chamber outlet can be configured to exhaust gases from a position below the reaction chamber 102, and thus may be separate from the reaction chamber outlet 107. In some embodiments, the loading chamber may not have an exhaust outlet separate from the reaction chamber outlet 107. In some embodiments, gases may flow from the loading chamber, into and through the reaction chamber, and exhaust out of the reaction chamber outlet 107. The loading chamber can comprise a gate valve 111. The gate valve 111 can allow for loading and unloading of substrates to and from the loading chamber 101. The gate valve 111 may allow access into the loading chamber 101, for example, from a transfer chamber, load lock, processing chamber, clean room, etc. The depicted configuration, such as the positions of the gate valve 111, inlets 104, 105 and outlet 107 are illustrative, and may be adjusted based on, for example, the process to be performed in the reaction chamber 102, the desired flow path of the gases, etc. For example, inlet 104 to the loading chamber can be separate from the gate valve 111.

The apparatus 100 can comprise a substrate support 108 configured to receive and support a substrate, such as a semiconductor workpiece W (e.g., a silicon wafer). The workpiece W may be loaded and unloaded onto and off of the substrate support 108 in various ways, such as with an end effector of a robot. The substrate support 108 can comprise a substrate retention portion of various configurations. For example, the substrate support 108 may comprise lift-pins and/or cutouts to aid in loading and unloading of the workpiece W with a paddle or fork. The substrate support 108 may comprise a vacuum system that holds the workpiece W in place after loading, or gravity alone may hold the workpiece W. The substrate retention portion can comprise a recess 109 formed in its upper surface that is sized and shaped to hold the workpiece W. In some embodiments, the recess 109 is between 300 mm and 500 mm in diameter. In some embodiments, the recess 109 is between 300 mm and 305 mm in diameter. In some embodiments, the recess 109 is between 450 mm and 455 mm in diameter. In some embodiments, the substrate support 108 can comprise materials including hastelloy C22 or Grade 2 titanium. The substrate support 108 can comprise a coating of AL2O3. The substrate support 108 can be moveable between a loading and a processing position, as described presently.

Figure 2A:
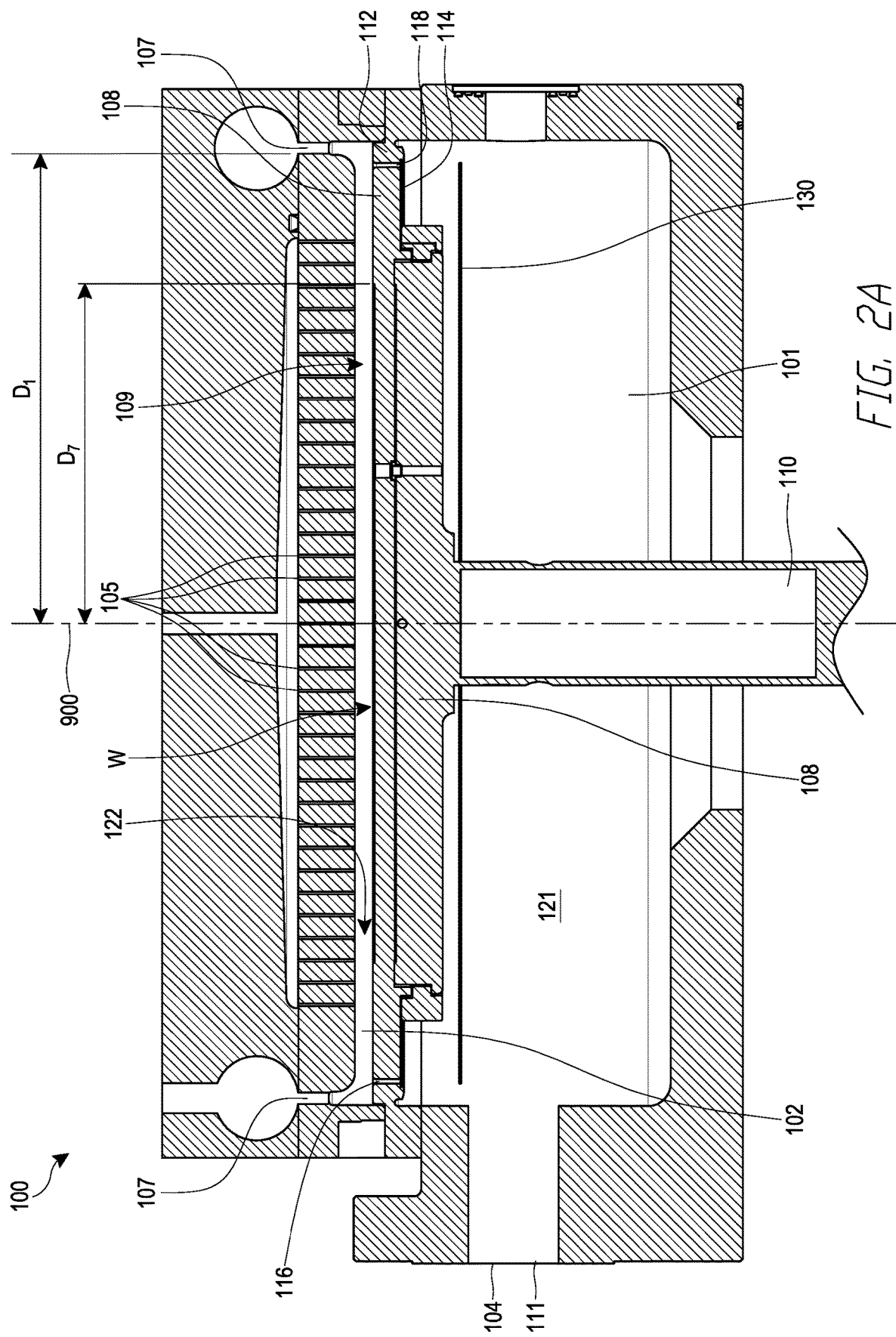
FIG. 2A is a front, cross-sectional view of an embodiment of the semiconductor processing apparatus of FIG. 1.
Figure 2B:
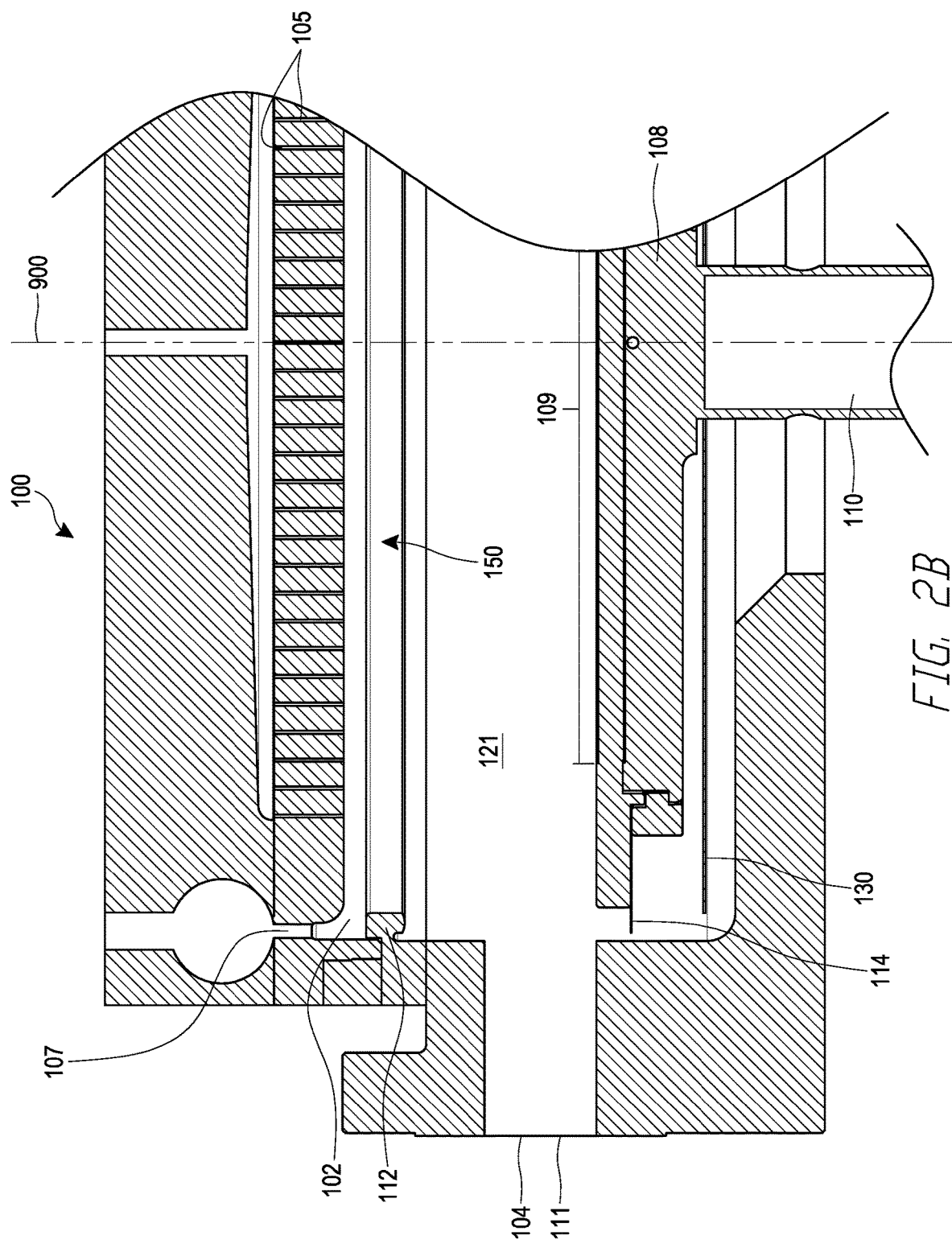
FIG. 2B is a front, cross-sectional view of an embodiment of a portion of the semiconductor processing apparatus of FIG. 1.

FIGS. 2A and 2B show front cross-sectional views of the semiconductor processing apparatus 100 from FIG. 1. FIG. 2A shows the apparatus 100 with the substrate support 108 in a processing (e.g. raised or upper) position. FIG. 2B depicts the substrate support 108 in a loading (e.g., lowered or lower) position. As shown, the reaction chamber 102 can comprise a baseplate 112 with an opening 150. The baseplate 112 and its opening 150 can be positioned approximately between a loading space 121 within the loading chamber 101 and a reaction zone 122 within the reaction chamber 102.

The apparatus 100 can comprise a movement element 110 configured to move the substrate support 108, and thus a workpiece W disposed on the substrate support 108, towards and away from the opening 150. Thus, the movement element 110 can move the substrate support 108 between the processing position shown in FIG. 2A and the loading position shown in FIG. 2B. When the substrate support 108 is in the processing position, the reaction zone 122 can be formed, to allow processing within the chamber 102. The movement element 110 can be configured to move the substrate support 108 towards the opening 150 to form a seal between the interior of the chamber 102 and the exterior of the chamber 102 (such as the loading chamber 101), as described further below. The movement element 110 can comprise any suitable drive mechanism configured to move the substrate support 108.

As described above, the reaction chamber 102 can be configured to include the plurality of inlets 105. Inlets 105 can be configured to direct gasses in a downward flow (e.g., showerhead) formation. For example, the inlet or inlets 105 can direct gasses at some substantially non-parallel (e.g., non-horizontal) angle relative to a substantially planar upper surface of the substrate support 108 and substrate W positioned on the support 108. In this way, the inlets 105 can be configured to form a substantially downward, non-parallel flow path of gases towards the substrate support 108 and substrate W.

The inlets and outlets can be advantageously positioned, to reduce contamination and improve uniformity, in combination with the sealing features described herein. For example, the inlets 105 can be disposed radially inwardly from the outlets 107 (relative to a centerline 900 of the substrate support 108). In some embodiments, the outlet 107 can comprise an exhaust ring with a ring shape, such as a ring-shaped cavity formed in the upper portion of the apparatus 100. The exhaust ring can extend around the substrate support 108. In some embodiments where the outlet 107 is a ring-shaped cavity, the outlet 107 can be disposed above the radially outer-most edge of reaction chamber 102. The outlet 107 can exhaust gasses from the reaction chamber 102. In some embodiments, all of the inlets 105 are disposed radially inwardly from the radially inner-most edge of the baseplate 112. In some embodiments, all of the inlets 105 are disposed radially inwardly from the radially outer-most edge of the substrate support 108.

The apparatus 100 can be configured to provide semiconductor fabrication processes that involve high reactor pressures and/or high flow rates, as described above. Moreover, some processes can include rapid changes in pressure and/or flow rates. In such scenarios, as described above, it can be beneficial to control or restrict the amount of flow between the loading chamber 101 and the reactor chamber 102 or vice versa, to avoid contamination and/or improve process uniformity. For example, it may be desirable to provide a hermetic seal between the loading chamber 101 and the reactor chamber 102, when the apparatus 100 is in a processing position. In some embodiments, it may be desirable to provide a seal between the loading chamber 101 and the reactor chamber 102 that allows some amount of flow therebetween, without providing a fully hermetic seal.

Embodiments of the sealing element described herein can provide these and other benefits and functionality. For example, the sealing elements can substantially restrict or completely close a flow path between the loading chamber and the reaction chamber. As shown in FIG. 2A, the sealing element 114 can be configured to form a seal between the baseplate 112 and the substrate support 108, such that the processing chamber 102 and the loading chamber 101 are substantially sealed relative to each other. The sealing element 114 can comprise metal. The sealing element 114 can comprise a flexible material, to provide a flexible diaphragm structure. For example, the sealing element 114 can comprise a material with a Young's Modulus between about 11,000 ksi to 32,000 ksi, to provide said flexibility. The sealing element can comprise a formed metal sheet with a thickness between about 0.8 and about 3 mm, or in some embodiments, about 1 mm and about 3 mm to provide said flexibility. Further ranges of thicknesses for one or more sealing elements are described below. In some embodiments, the sealing element 114 can comprise materials including, but not limited to hastelloy C22 or Grade 2 titanium. The sealing element 114 can comprise a coating of at least one of $Al_2O_3$, ZrO, or Yttrium Oxide.

FIGS. 3A-3D illustrate the how the sealing element 114 interacts with the baseplate 112 and substrate support 108 to form a seal according to an embodiment of a semiconductor processing apparatus 100.

Figure 3A:
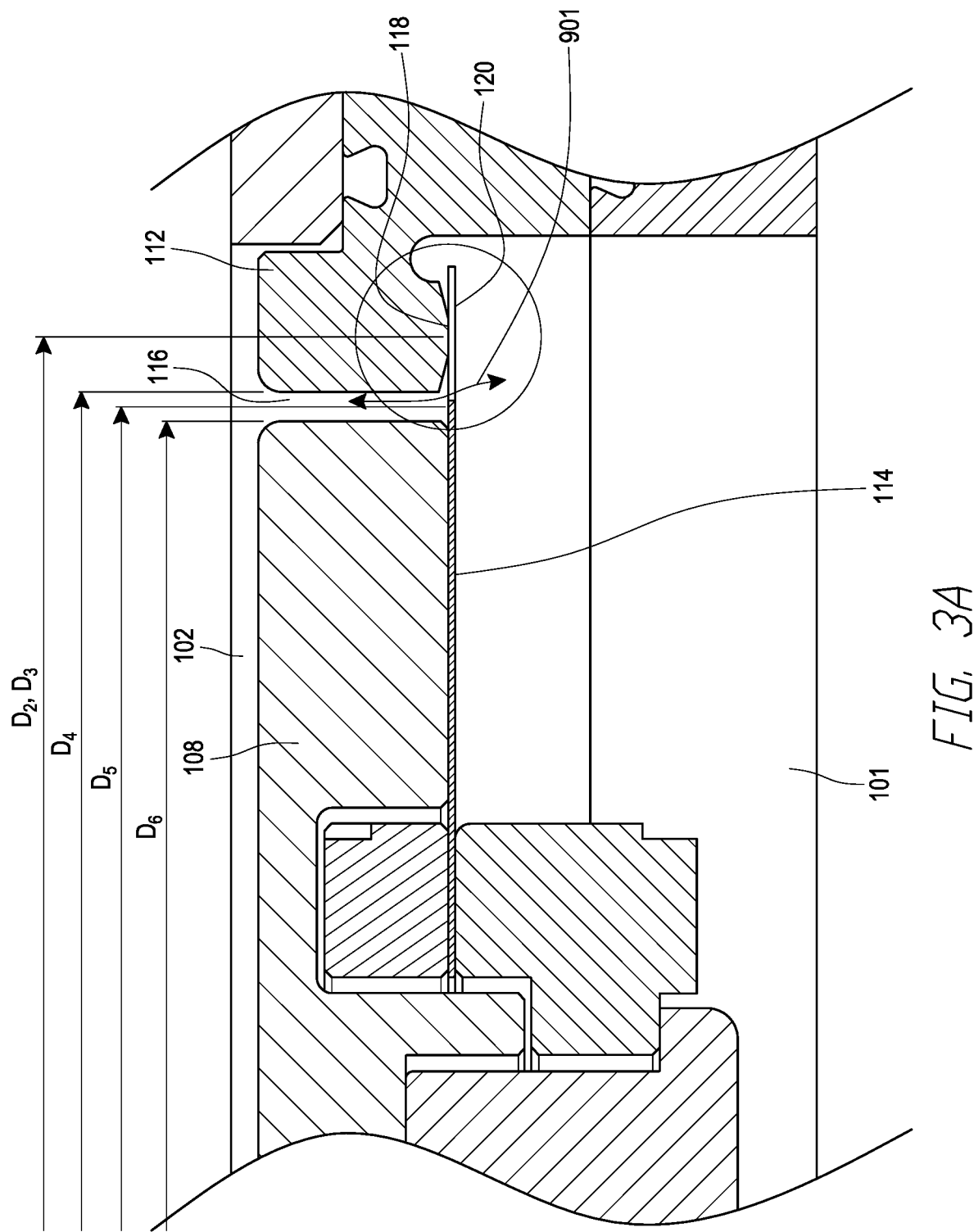
FIG. 3A is an enlarged, cross sectional view of a contact seal isolating the loading chamber from the reaction chamber according to an embodiment of a semiconductor processing apparatus.

FIG. 3A shows an enlarged view of a portion of the apparatus 100 in FIG. 2A, in a processing position, with an embodiment of the sealing element 114. The apparatus 100 can comprise a gap that provides a flowpath, such as a gap 116 and a flowpath 901, between the processing chamber 102 and the loading chamber 101, when the apparatus 100 is in the processing position. For example, the gap 116 can be disposed between the substrate support 108 and the baseplate 112. The gap 116 can extend radially (e.g., horizontally) between the substrate support 108 and the baseplate 112 as shown. In some embodiments, the substrate support 108 and baseplate 112 can be configured to lack any vertical gap between these two components. For example, the inner perimeter of baseplate 112 can be located at a greater radial position than an outer perimeter of the substrate support 108. In such embodiments, the seals described elsewhere herein can be formed without a substantial vertical gap between the substrate support 108 and the baseplate 112.

The sealing element 114 can be configured to cover or bridge the gap 116 between the baseplate 112 and a portion of the substrate support 108. The sealing element 114 can create a seal 118 between chambers 101 and 102. The seal 118 can be a contact seal formed through direct contact between a portion of the sealing element 114 and another component. The contact seal can be a metal-to-metal contact seal. The seal 118 can substantially prevent gas from flowing from the loading chamber 101 to the reaction chamber 102. In this way, the seal 118 can substantially fluidly isolate the reaction chamber 102 from the loading chamber 101, such that process gas flow is completely or partially restricted between the reaction chamber 102 and the loading chamber 101. For example, the seal 118 can restrict gas flow through the flow path 901 within the gap 116. Embodiments of the sealing elements described herein may be implemented to restrict flow through other flow paths formed between other components, and to cover or seal other gap configurations than a horizontal or radially extending gap.

As described above, it may be beneficial to provide a seal between the loading chamber 101 and the processing chamber 102 that allows some limited amount of flow therebetween. In some embodiments, the sealing element 114 can comprise one or more apertures 120 to provide these benefits. The apertures 120 can be any of a number of different shapes, sizes, quantities, and positions through the sealing elements described herein. In some embodiments, the apertures 120 can take the form of holes (e.g. round holes) in the sealing element 514. In some embodiments, the apertures 120 can be shaped like slits. "Slit" and "slot" are used interchangeably herein, and refer to a generally non-round, elongated aperture with a length that is greater than its width. In some embodiments, the apertures can be positioned around an edge of the sealing element 114 (to form a "notch" or other structure that forms an open perimeter that is not fully enclosed), whereas in other embodiments, the apertures can be positioned a sufficient distance from an edge of the sealing element 114 to form a fully enclosed perimeter around the aperture.

As shown, the apertures 120 can be formed in the outer edge of the sealing element 114, to form a notch. For example, the apertures 120 can be spaced (e.g., evenly) around the outer edge of the sealing element 114. The apertures 120 can allow flow path 901 to extend through the sealing element 114. By allowing a path for gas to flow through the sealing element 114, and controlling the configuration of the apertures 120, the apertures 120 can be used to control the amount of gas flow allowed between chambers 101 and 102. For example, the apertures 120 can control the amount of purge gas into the reaction chamber 102 from loading chamber 101.

Embodiments of the gap, the seal, the sealing element, and other components herein can be advantageously positioned, with respect to each other or other components to provide improved performance. For example, and with reference to FIGS. 2A and 3A, the exhaust port 107 can be positioned at a distance D1 from the center of substrate support 108. The seal 118 can be positioned at a distance D2 from the center of the substrate support 108. The apertures 120 can be positioned at a distance D3 from the center of the substrate support 108. Note that the distance D2 and D3 are shown as being the same in FIG. 3A but they can be the same or different with respect to each other. The inner edge of the baseplate 112 can be positioned at a distance D4 from the center of the substrate support 108. The gap 116 can be positioned at a distance D5 from the center of the substrate support 108. The outer edge of the substrate support 108 can be positioned at a distance D6 from the center of the substrate support 108. An outer edge of the substrate retention portion 109 can be positioned at a distance D7 from the center of the substrate support 108.

In some embodiments, the seal 108 can be positioned at a greater radial distance D2 from the center of the substrate support 108 than the distance from the outer edge of the substrate support 108 to the center D6. In some embodiments, at least one of the apertures 120 and the seal 108 can be positioned at a radial distance D3, D2, respectively, that is less than or equal to the distance D1 of the exhaust port 107, relative to a center of the substrate support 108. In some embodiments, the apertures 120 can be arranged at a greater radial distance D3 from the center of the substrate support 108 than the distance D5 to the gap 116. In some embodiments, the exhaust port 107 can be located at a greater radial distance D1 from the center of the substrate support than a distance from the center of the substrate support to the outermost plurality of gas inlets 105. In some embodiments, the plurality of gas inlets 105 is located radially inwardly from an inside edge of the baseplate 112 (i.e. the plurality of gas inlets 105 is at a smaller distance from the center of the substrate support 108 than the distance D4). In some embodiments, the radial distance between the outer edge of the substrate retention portion 109 and the seal 118 (i.e., D2-D7) is between about 50 mm to about 65 mm. In some embodiments, the seal 118 can be positioned radially from the center of the substrate support 108 at a distance D2 of at least 30% or greater than the distance D7 between the center of the substrate support 108 and an outer edge of the substrate retention portion 109. In some embodiments, the seal 118 can be positioned radially from the center of the substrate support 108 at a distance D2 of between 30% and 40% greater than the distance D7 between the center of the substrate support 108 and an outer edge of the substrate retention portion 109. The gap 116 can be located at a radial distance D5 from the center 900 of the substrate support 108 that is less than the radial distance D1 of the reaction chamber outlet 107 from the center of the substrate support 108. In some embodiments, the gap 116 is located at a radial distance of about 45 mm to about 55 mm away from an outer edge of the substrate retention portion 109. In some embodiments, the gap 116 comprises a width of about 5 mm. The apertures 120 can be located at a radial distance D3 from the center of the substrate support 108 that is less than the radial distance D1 of the reaction chamber outlet 107 from the center of the substrate support 108. In some embodiments, the apertures 120 allow a total of about 50 sccm to about 200 sccm of flow through the sealing element.

In some embodiments, the substrate support 108 can comprise an upper portion and a lower portion. In such embodiments, the lower portion can be a separate piece that is coupled to the upper portion. The upper portion of the substrate support 108 can comprise the substrate retention portion 109. In some embodiments, the lower portion of the substrate support 108 can comprise a heating element suitable to heat the substrate support 108. In some embodiments, the apparatus 100 comprises a heat shield 130 disposed beneath the substrate support 108. The heat shield 130 can block at least a portion of heat transfer from the heating element to the loading chamber 101. In some embodiments, the mounting hardware configured to mount the sealing element can also be used to mount the heat shield to the substrate support.

The sealing element can be positioned with respect to (e.g., attached to) various components of apparatus 100 suitable to provide the functionality described herein. The sealing element 114 can be disposed on, e.g., attached to, the underside of a portion of the substrate support 108, such as a radially-extending upper portion of the substrate support 108, as shown. When attached to the substrate support 108, a portion of the sealing element 114 can contact and form the seal 118 with the baseplate 112 when the substrate support 108 is in a processing position. The seal 118 can be formed with the baseplate 112 along a substantially radially outward portion of the sealing element 114, such as its outer perimeter or circumference (see also FIGS. 3B and 3C).

To form a stronger seal 118, components of apparatus 100 can be configured at advantageous positions with respect to each other, to provide a "bias" between sealing element 114 and the other component(s) with which it forms seal 118. For example, the portion of the substrate support 108 on which the sealing element 114 is mounted (such as the underside surface shown) can be positioned at a slightly higher vertical elevation than the corresponding sealing surface on substrate support 108. Such differences in elevation can provide a spring-like force or "bias" between the sealing element 114 and the sealing surface on substrate support 108, increasing the strength of seal 118. The term "overdrive" is used herein to describe this condition when the substrate support has been or is moved past the point of initial sealing contact, relative to the baseplate. The amount of overdrive can affect the bias between the sealing element and the baseplate and/or substrate support, as described further herein, and increase the allowable pressure differential across the sealing element during processing. In some embodiments, the lower portion of substrate support 108 can be positioned at an elevation between about 1 mm and about 2 mm higher than that of the seal 118 on baseplate 112. In some embodiments, the sealing element 114 may flex or otherwise deflect when the overdrive is increased, and the substrate support is in a processing position. The sealing element 114 can be made from a resilient material, such as a flexible metal, to provide such flex and bias.

Figure 3B:
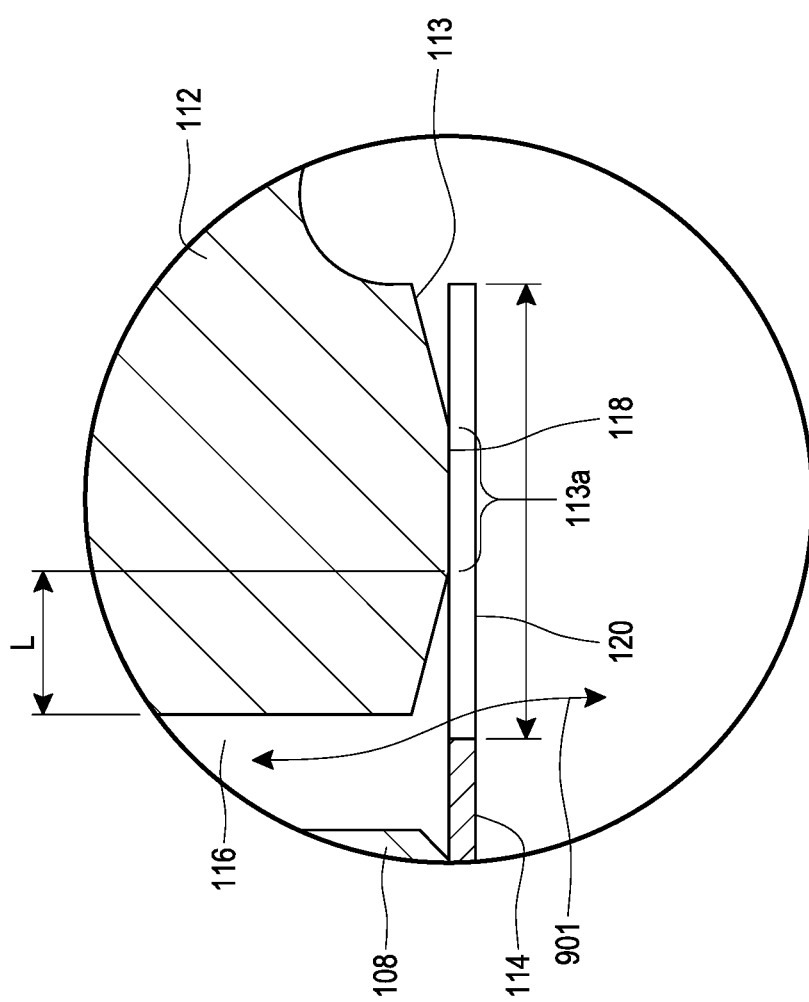
FIG. 3B is an enlarged view of a portion of FIG. 3A.

FIG. 3B shows an enlarged view of a portion of FIG. 3A showing the seal 118. As discussed above, the sealing element 114 can be attached to a portion of the substrate support 108 (e.g., the underside of the support 108), with the seal 118 formed between the point of contact of the sealing element 114 and the baseplate 112. Other embodiments are possible. For example, a sealing element can be attached to a first component, with a seal formed at the point of contact between the sealing element and a second component. Thus, for example, the sealing element can be attached to a stationary component, such as the baseplate, with a seal formed between the sealing element and the substrate support. In some embodiments, the sealing element(s) can have a "floating" attachment to both the baseplate and the substrate support, where the sealing element(s) are capable of contacting and being held or biased against these components (e.g., through gravity), but not attached with a structural attachment feature such as a weld, screw, bolt, adhesive, etc. Such embodiments can allow a contact seal to be formed between each of the sealing element and the baseplate, and between the sealing element and the substrate support, without additional attachment mechanisms.

In some embodiments, the baseplate 112 comprises a surface with a varying elevation that forms a peak or apex, such as a substantially non-planar or curved surface, or a surface with multiple planar surfaces angled to form an apex. In embodiments where the baseplate 112 comprises a surface with a varying elevation, such as surface 113, the contact seal 118 can be formed at the contacting portion(s) between an apex 113a of the surface 113 and the sealing element 114. In some embodiments, a non-planar surface, or curved surface for engagement and sealing with the sealing element, can provide mechanical conformance for the contact seal. For example, the sealing element may wrap or conform along a curved surface of the component to which the sealing element is contacting, to increase the surface area of the seal.

Figure 3C:
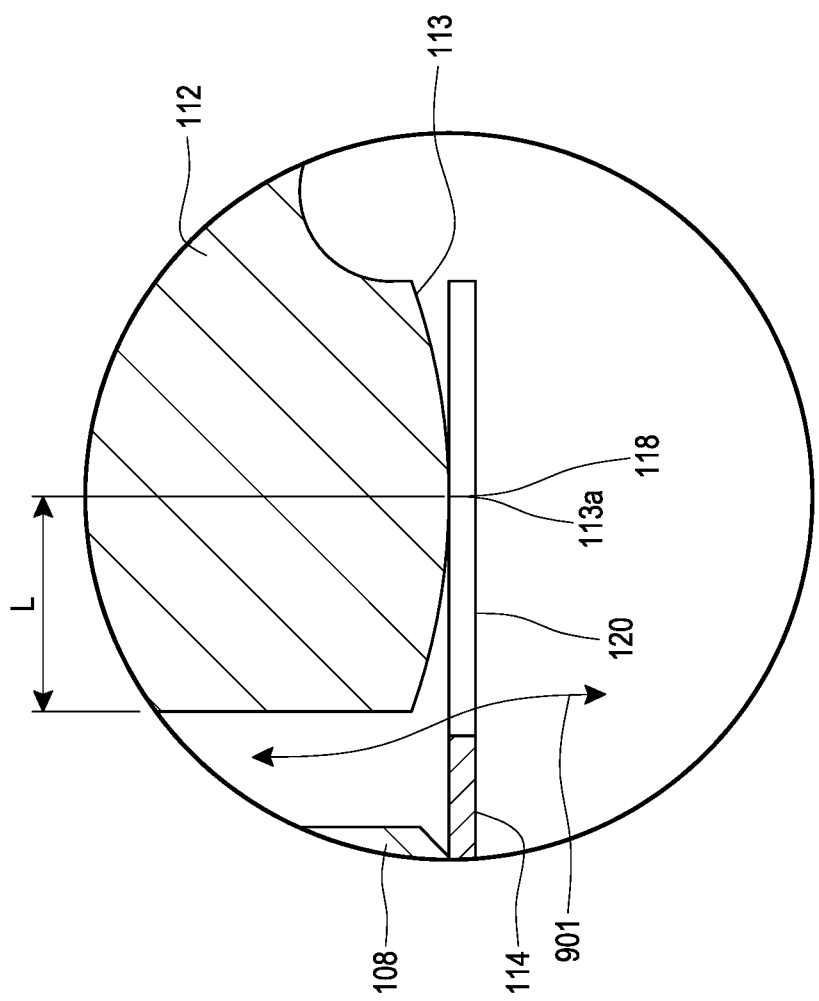
FIG. 3C is an enlarged view similar to FIG. 3B but of an embodiment with a baseplate having a curved surface.

FIG. 3C shows an embodiment similar to FIG. 3B but of an embodiment where the surface 113 is curved. The contact seal 118 can be formed at the contacting portion(s) between the apex 113a of the curved surface 113 and the sealing element 114. In some embodiments where the curved surface 113 and/or the sealing element 114 have undergone some amount of deformation, the contact seal 118 may exist across a larger portion than a single point when viewed in a cross-section. This deformation may occur as the result of force being applied to compress the curved surface 113 and sealing element 114 together. Thus, in some embodiments, upon forces being applied between the sealing element 114 and the baseplate 112, the embodiment shown in FIG. 3C may result in a configuration similar to that shown in FIG. 3B.

Figure 3D:
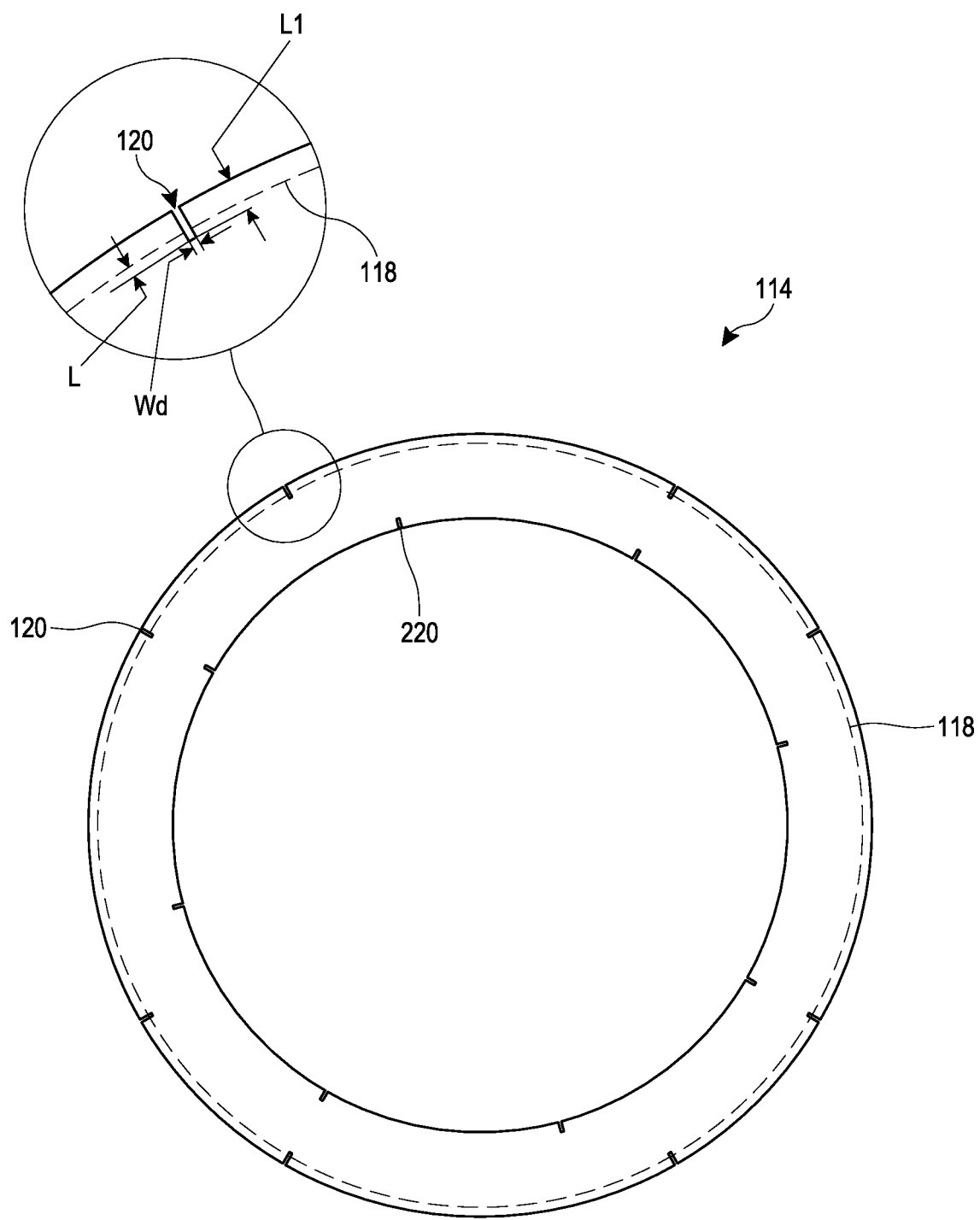
FIG. 3D is a top view of a sealing element according to an embodiment.

FIG. 3D shows a top view of the sealing element 114 according to an embodiment of the semiconductor processing apparatus 100. Referring to both FIGS. 3B and 3C, the apertures 120 can be located around a perimeter (e.g., the peripheral edge) of the sealing element 114. In some embodiments, the apertures 120 can each be configured to extend radially across the apex 113a of the surface 113 when apparatus 100 is in a processing position and seal 118 is formed (FIG. 3B). The apertures 120 can be configured such that at least a portion of the radially extending length of the apertures (shown as dimension "L") is on the radially inward side of the apex of the surface 113. The apertures 120 can allow gas flow through the sealing element 114 and flow path 901, within the gap 116 through at least this portion of the apertures on the radially inward side of the apex 113a of the surface 113. The apertures can be positioned at a radial position that is approximately the same as or greater than the radial position of the gap 116. In some embodiments, the apertures can be holes (e.g., round holes) instead of slit apertures 120. In some embodiments, holes may be configured in the same arrangement as the slit apertures 120 of FIG. 3D.

In some embodiments, the apertures can comprise slots extending through the sealing element 114, although many different shapes are suitable. For example, apertures 120 are shown as slots with a width Wd and length L1. The contact seal 118 is depicted in FIG. 3C by a dotted line forming a first circumference that shows where the apex 113a of the surface 113 contacts the sealing element 114 according to some embodiments. A second circumference extending through apertures 120 around the sealing element 114 will generally be less than the first circumference formed by the shape of the contact seal 118. In some embodiments, the total circumference of the sealing element 114 that comprises apertures 120 will be far less than the total circumference of the sealing element 114 that comprises the contact seal 118. In some embodiments, the circumference of the sealing element 114 that comprises the contact seal 118 is 500 to 550 times greater than the circumference of the sealing element 114 that comprises the apertures 120. In some embodiments, the sealing element 114 comprises a total of 12 apertures 120. In some embodiments, the apertures 120 are each about 5.5 mm long and about 0.2 mm wide. However, a person of skill in the art will recognize that the apertures 120 can come in a variety of different numbers and sizes. In some embodiments, the total effective area of the apertures 120 is between 4 mm$^2$ and 6 mm$^2$. In some embodiments, the total effective area of the apertures 120 is about 4.8 mm$^2$ where the total effective area is equal to the area of the apertures that is radially inward from the seal 118. As shown, the effective area is defined by the dimension L (FIGS. 3B and 3C) and the width W of the apertures 120 (FIG. 3D). In some embodiments, the total area of the apertures 120 is about 13.2 mm$^2$.

In some embodiments, the sealing element 114 can comprise a second plurality of apertures 220 formed on the sealing element 114. The apertures 220 can be similarly configured as apertures 120, or differently configured. The apertures 220 can be positioned on a substantially radially inner portion of sealing element 114, compared to the first plurality of apertures 120. For example, sealing element 114 can comprise a substantially annular shape, with the apertures 220 spaced (e.g., evenly) around the inner edge of the inner diameter of the sealing element 114. The apertures 220 can reduce compressive stress due to differences in temperature across the sealing element 114 during processing.

FIGS. 4-7 show embodiments of semiconductor processing apparatuses which can include some similar features, and some different features, relative to those embodiments of apparatus 100 shown in FIGS. 1-3C. It will be appreciated that some aspects of the embodiments shown in FIGS. 4-7 may be implemented in combination with or instead of some aspects shown in FIGS. 1-3C, and vice versa.

For example, the embodiments shown in FIGS. 4-7 can include a flow control ring 119. In some embodiments, the flow control ring 119 can be an integral or separate component relative to the substrate support 108. The flow control ring 119 may be implemented in order to retrofit existing equipment with embodiments of the sealing elements and seals described herein.

The flow control ring 119 can encircle the circumference of the substrate support 108. In some embodiments, the flow control ring 119 can comprise materials including, but not limited to hastelloy C22 or Grade 2 titanium. The flow control ring 119 can comprise a coating of AL203. In some embodiments including the embodiments illustrated in FIGS. 4-7, the flow control ring 119 can be removed and replaced by the substrate support 108, or portions thereof. In those embodiments, the substrate support 108 is larger radially than the embodiments illustrated, and the substrate support 108 extends to the same distance radially as the flow control ring 119 would otherwise have extended.

Figure 4:
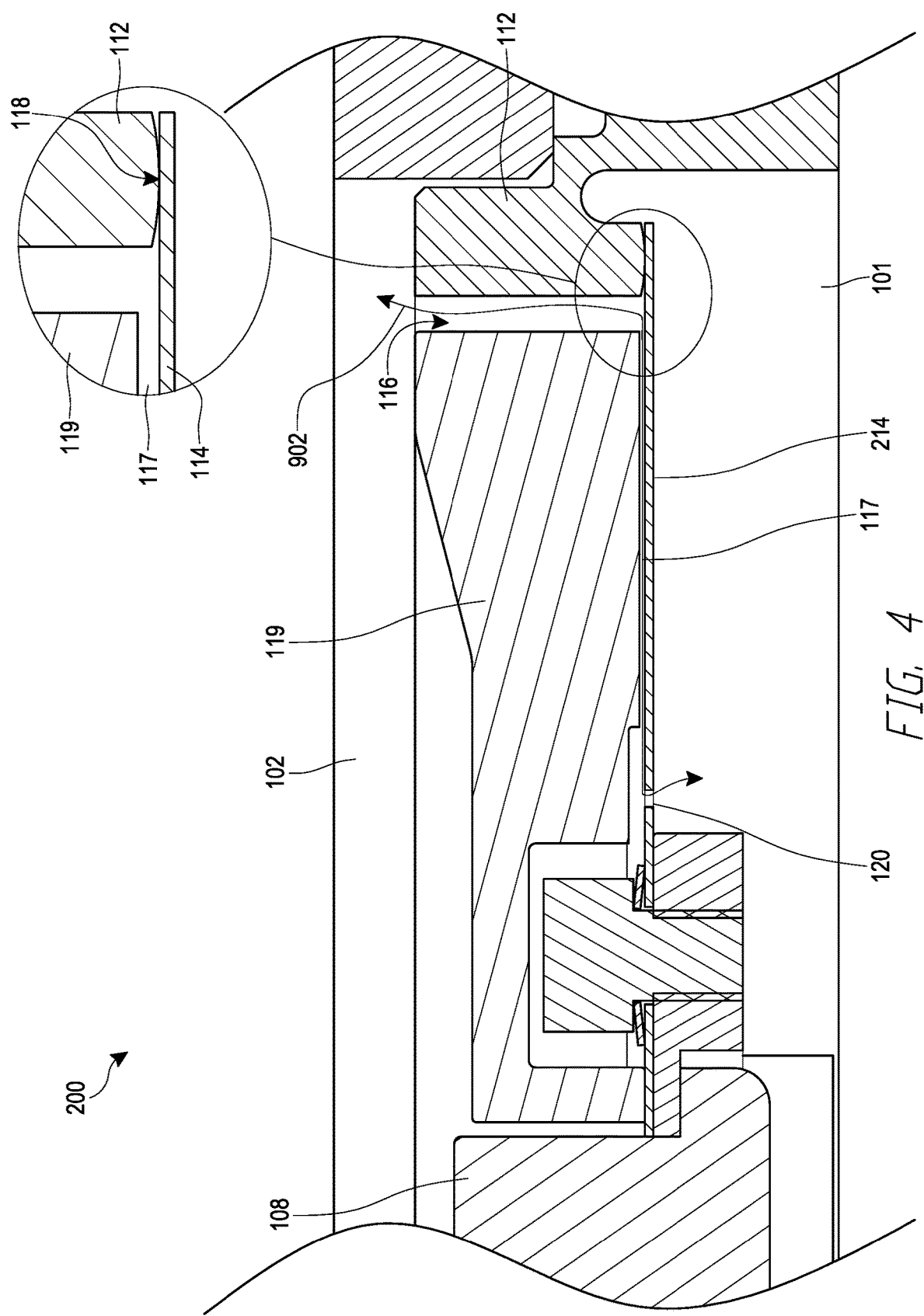
FIG. 4 is an enlarged, cross sectional view of a seal isolating the loading chamber from the reaction chamber according to an embodiment of a semiconductor processing apparatus.

FIG. 4 shows an enlarged cross-sectional view of one embodiment of a sealing element 214 the forms a contact seal 118 isolating the loading chamber 101 from the reaction chamber 102 of a semiconductor processing apparatus 200. In some embodiments, the apparatus 100 can have a flow control ring 119. The flow control ring can be disposed radially between the substrate support 108 and the gap 116. The flow control ring 119 can be coupled to the substrate support 108.

A sealing element 214 can be disposed on the under-side of the flow control ring 119. Apparatus 200 and sealing element 214 can be similar to apparatus 100 and sealing element 114, with some differences. For example, apertures 120 can be positioned on the sealing element 214 at a radial position that is less than that of the gap 116. A vertically extending gap 117 can be disposed between the flow control ring 119 and sealing element 114. In some embodiments, the vertical gap 117 can be created by moving the lower surface of the flow control ring 119 to a higher elevation than the baseplate 112, and flexing the sealing element 214 away from the lower surface of the flow control ring 119. In some embodiments with the vertical gap 117, a flowpath 902 can be formed extending through gap 116, the vertical gap 117, and apertures 120, to allow flow between the loading chamber 101 and the reaction chamber 102. Although illustrated with a flow control ring 119, the embodiments illustrated in FIG. 4 and described herein can also comprise an extended substrate support 108 instead of the flow control ring 119.

Figure 5:
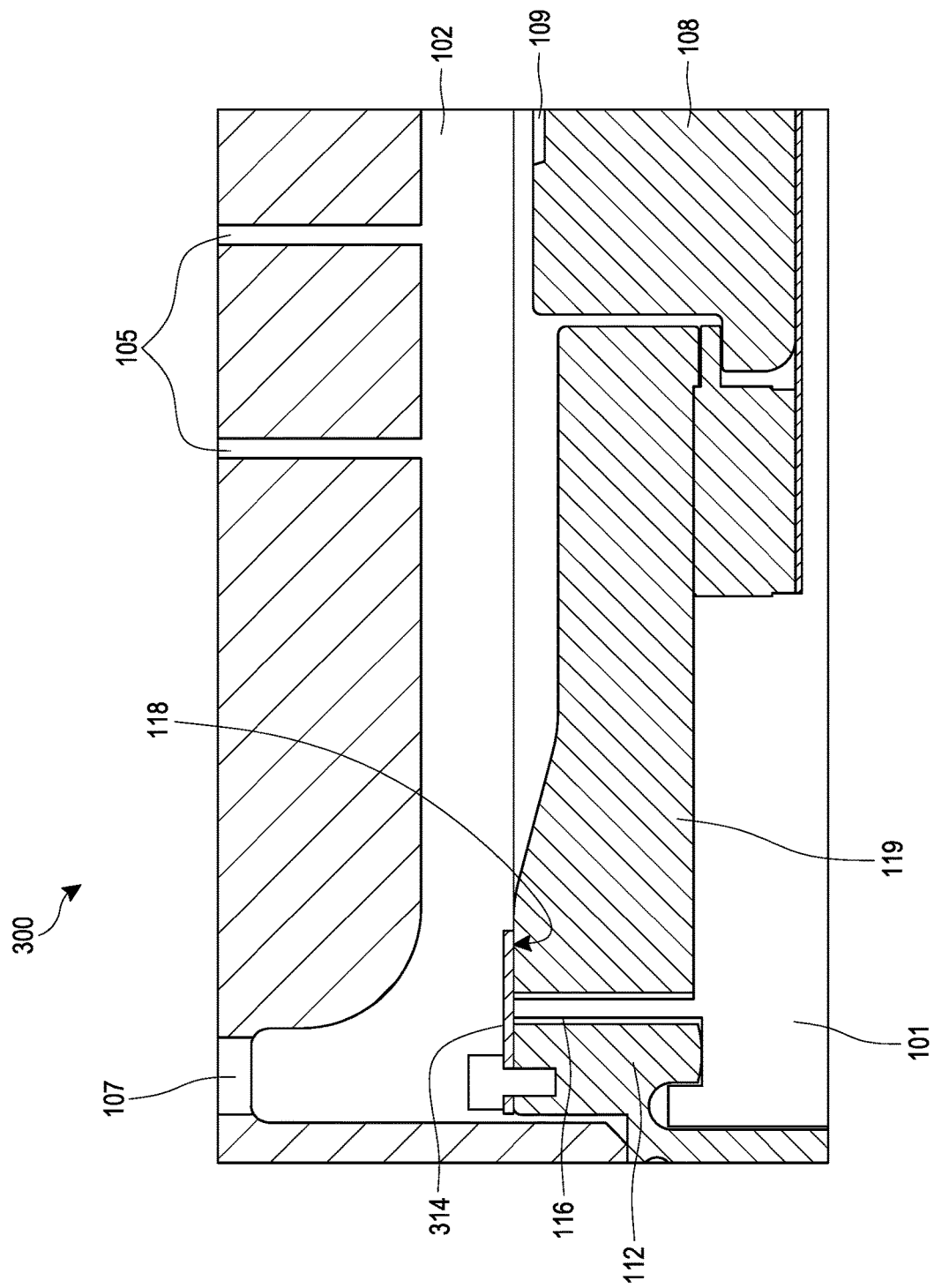
FIG. 5 is an enlarged, cross sectional view of a seal isolating the loading chamber from the reaction chamber according to an embodiment of a semiconductor processing apparatus.

FIG. 5 shows an enlarged cross-sectional view of an embodiment of a sealing element 314 forming a contact seal 118 isolating the loading chamber 101 from the reaction chamber 102 of a semiconductor processing apparatus 300. In some embodiments, the contact seal 118 can be disposed on the upper side of the gap 116. The sealing element 314 can be affixed to the baseplate 112 (e.g., to an upper surface of baseplate 112). The sealing element 314 can also contact the flow control ring 119 and form the contact seal 118 when the apparatus 300 is in a processing position. By having the sealing element 314 disposed on the upper side of the gap 116, this design can take advantage of high pressure in the reactor chamber 102 that can apply downward pressure on the sealing element 314. This downward pressure on the sealing element 314 can create a stronger seal. Although not illustrated in FIG. 4, the sealing element 314 can comprise apertures 120 disposed over the gap 116 (e.g., at a similar radial position). Although illustrated with a flow control ring 119, the embodiments illustrated in FIG. 5 and described herein can also comprise an extended substrate support 108 instead of the flow control ring 119.

Figure 6:
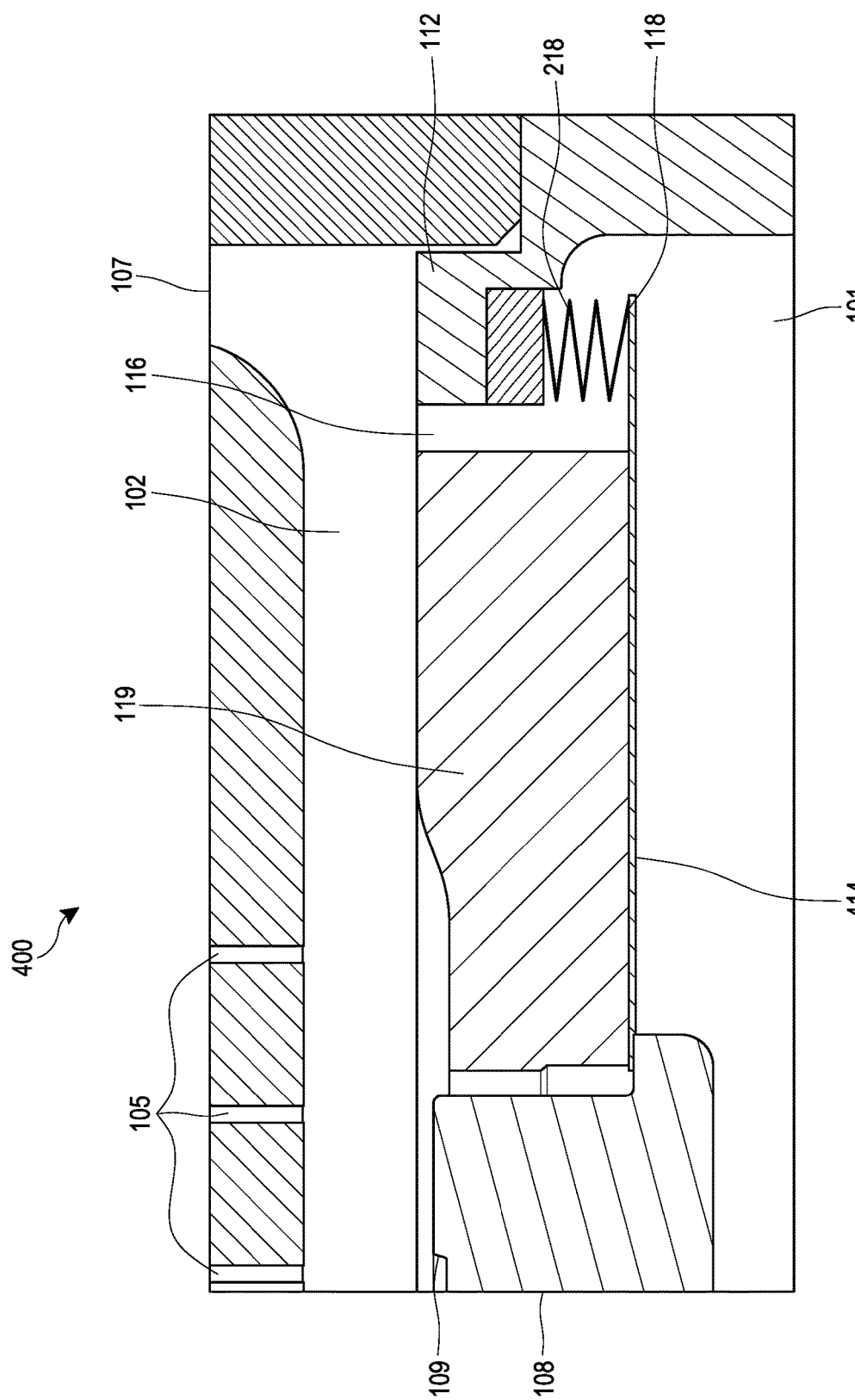
FIG. 6 is an enlarged, cross sectional view of a seal isolating the loading chamber from the reaction chamber according to an embodiment of a semiconductor processing apparatus.

FIG. 6 shows an enlarged view of a contact seal 118 according to one embodiment of a semiconductor processing apparatus 400. Apparatus 400 can comprise bellows 218. In some embodiments, the baseplate 112 can comprise bellows 218. The bellows 218 can contact the sealing element 414. The contact seal 118 can be formed at the contact between the bellows 218 and the sealing element 414. In some embodiments, the bellows 218 can be formed integrally with or attached to the sealing element 414, and the seal 118 can be formed between the bellows and the baseplate 112. In some embodiments, the bellows 218 can comprise three convolutions. The bellows 218 can be compressible. The compression of the bellows 218 can provide compliance for the contact seal 118. In some embodiments, the bellows 218 can be compressed up to 1 mm-2 mm. Although not illustrated in FIG. 5, the sealing element 414 and/or the bellows 218 can comprise apertures, similar to apertures 120 in the other embodiments, so that gas may flow through the sealing element 414. These apertures can be disposed on the peripheral edge of the sealing element 414 or somewhere more radially inward, for example, under the gap 116. Although illustrated with a flow control ring 119, the embodiments illustrated in FIG. 6 and described herein can also comprise an extended substrate support 108 instead of the flow control ring 119.

Figure 7:
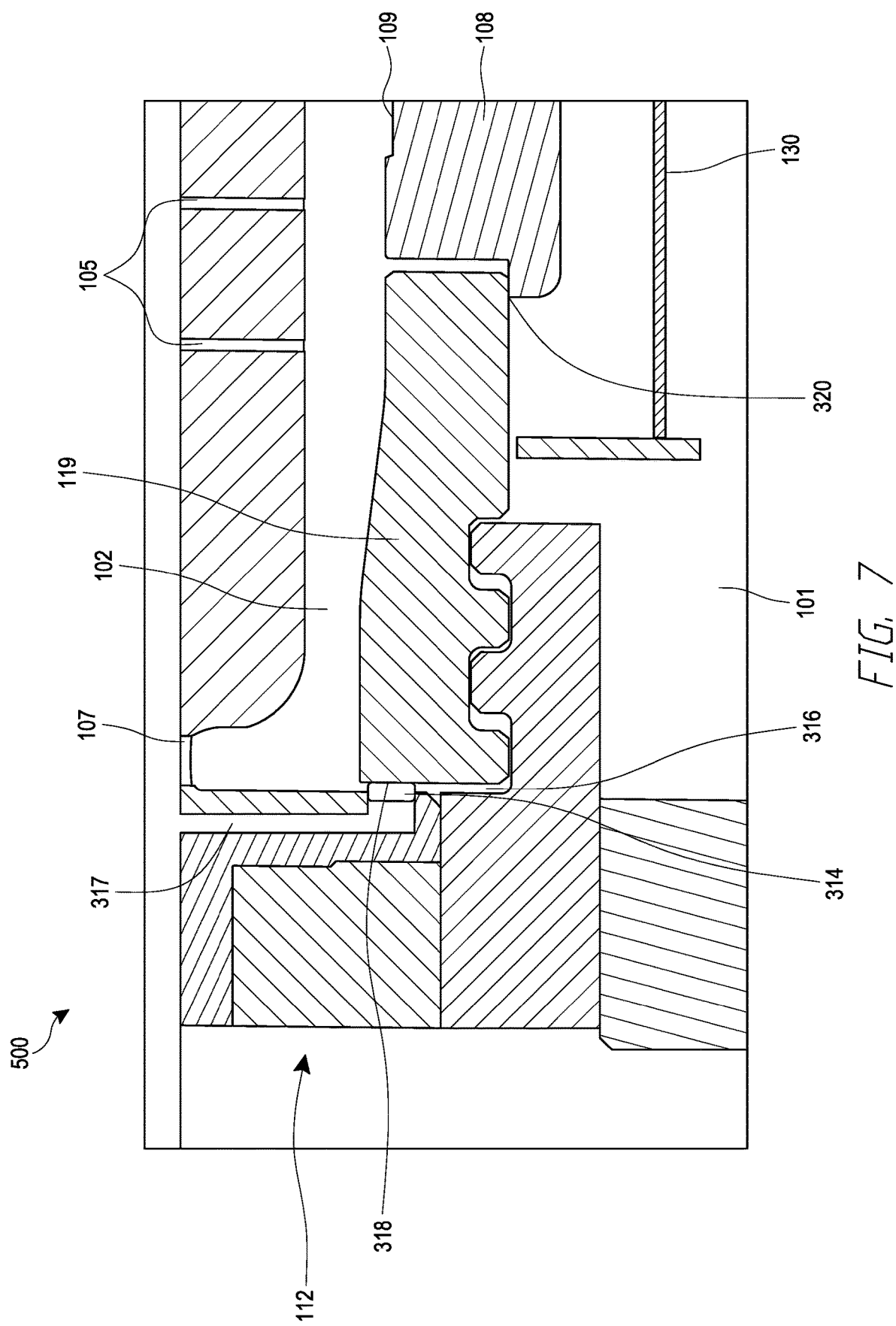
FIG. 7 is an enlarged, cross sectional view of a seal isolating the loading chamber from the reaction chamber according to an embodiment of a semiconductor processing apparatus.

FIG. 7 shows an enlarged, cross sectional view of a seal 318 isolating the loading chamber 101 from the reaction chamber 102 according to an embodiment of a semiconductor processing apparatus 500. In some embodiments, the sealing element 314 can comprise an elastic or elastomeric material. In some embodiments, the apparatus 500 can comprise a pneumatic input 317. The pneumatic input 317 can pneumatically actuate the sealing element 314. The pneumatic input 317 can actuate the sealing element 314 by providing pressurized gas to the sealing element 314. In some embodiments, the pneumatic input 317 can extend through a portion of the apparatus 500. In some embodiments, the pneumatic input 317 can extend through the baseplate 112. In some embodiments, the apparatus will comprise a gap 316 where gas could possibly flow between the loading chamber 101 and the reaction chamber 102 when the substrate support 108 and moving element 110 are in a loading position. The sealing element 314 can span across the gap 316 between the baseplate 112 and the flow control ring 119 when the sealing element 314 is actuated, or in an engaged or pressurized configuration. In some embodiments, gas can flow between the loading chamber 101 and the reaction chamber 102 through gaps in the labyrinth formed between the flow control ring 119 and the baseplate 112. The apparatus 500 can comprise a seal 318. The seal 318 can be formed where the sealing element 314 contacts the flow control ring 119. In some embodiments, the apparatus 100 can comprise a second seal 320 where the substrate support 108 and the flow control ring 119 engage in the loading position. The second seal 320 can comprise a metal to metal seal. Although illustrated with a flow control ring 119, the embodiments illustrated in FIG. 7 and described herein can also comprise an extended substrate support 108 instead of the flow control ring 119. A similar pneumatic actuator such as that is shown in FIG. 7 can be implemented in other embodiments described herein. For example, a pneumatic input and pneumatic sealing element similar to those in FIG. 7 could be extended horizontally from the baseplate 112 to create a seal against the substrate support 108 in the embodiments shown in FIGS. 3A-3C.

Figure 8B:
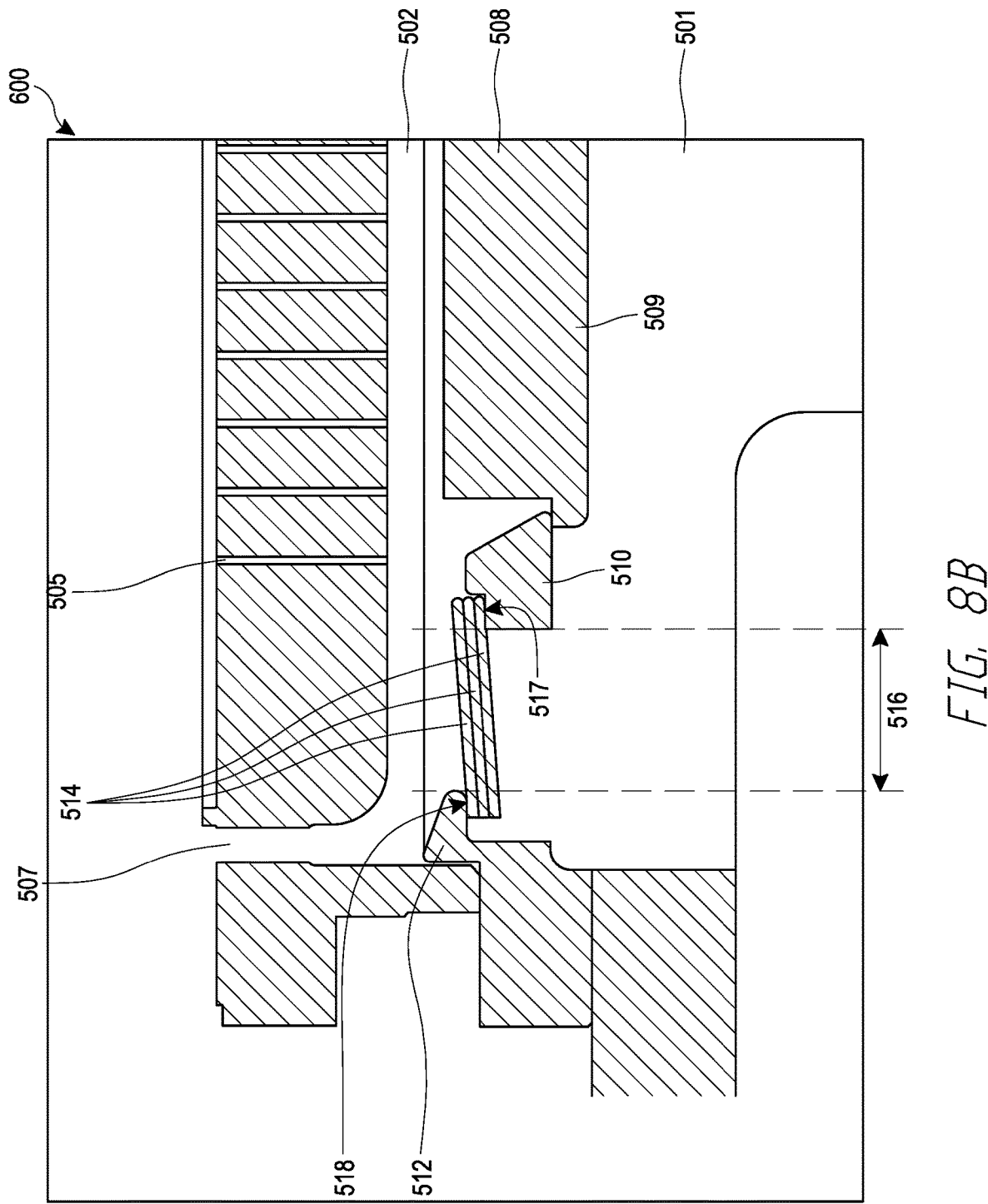
FIG. 8B is a cross-sectional view of an embodiment of a semiconductor processing apparatus with multiple sealing elements.

FIGS. 8A & 8B show embodiments of a semiconductor processing apparatus 600. Apparatus 600 can include some similar features, and some different features, relative to those embodiments of apparatuses 100 and 500 shown in FIGS. 1-7. For example, apparatus 600 can include a substrate support 508 and baseplate 512, with a gap (e.g., horizontal gap) 516 therebetween, with, one or more sealing elements 514 (e.g., metal sealing elements) configured to form a seal between the substrate support 508 and baseplate 512, similar to the other substrate supports, baseplates, gaps and sealing elements described herein.

Apparatus 600 provides further embodiments in which it may be desirable to provide a hermetic seal between the loading chamber 501 and the reactor chamber 502 when the apparatus 600 is in a processing position. The apparatus 600 can be configured to provide semiconductor fabrication processes that involve high reactor pressures and/or high flow rates. Moreover, some processes can include rapid changes in pressure and/or flow rates. Thus, it may also be desirable to provide a hermetic seal which is capable of withstanding substantial pressure differentials and changes. Embodiments of apparatus 600 can include two or more sealing elements (e.g., stacked sealing elements), and/or two contact seals for a single sealing element (or single set of sealing elements). It will be appreciated that some aspects of the embodiments shown in FIGS. 8A and 8B may be implemented in combination with or instead of some aspects shown in FIGS. 1-7, and vice versa. For example, the embodiments described with respect to FIGS. 8A and 8B that have two or more sealing elements and/or two contact seals for a single sealing element or set can be similarly implemented within the other semiconductor apparatuses herein.

FIG. 8A is a cross-sectional view of an embodiment of a semiconductor processing apparatus 600. FIG. 8A shows the semiconductor apparatus 600 in a configuration where the substrate support 508 is in the processing position. Apparatus 600 can comprise one or more sealing elements 514. In some embodiments, apparatus 600 can comprise two or more sealing elements 514, as described below and shown with reference to FIG. 8B.

The sealing elements 514 can form a contact seal between different portions of substrate support 508, or intervening components, to form a seal between the baseplate 512 and the substrate. For example, substrate support 508 can include a first portion, such as contact ring 510, on which sealing element forms a contact seal, configured to attach to a second support portion 509. Contact ring 510 can include portions that extend outwardly from support portion 509, and/or above support portion 509. Contact ring 510 can be an integral or separate component relative to the substrate support 508, or support portion 509. In some embodiments, the contact ring 510 can be fabricated from materials with insulative properties. The contact ring 510 can be capable of providing a thermal barrier between the sealing element 514 and the substrate support 508, or other portions of the substrate support 508, such as support portion 509. Having a thermal barrier can prevent accelerated degradation of sealing element(s) 514, thereby extending the working lifetime of sealing element(s) 514.

In some embodiments, the sealing element(s) 514 can rest on some component connected or coupled to the substrate support 508, such as contact ring 510, such that they move together. The sealing element 514 can span the horizontal gap 516 between the baseplate 512 and the substrate support 508, similar to other sealing elements herein.

In some embodiments, apparatus 600 can be configured to include two (or more) contact seals between two (or more) different portions of a single sealing element 514 and other components, to form a seal between the baseplate and the substrate support. For example, with reference to FIG. 8A, a first (e.g., outer) contact seal 518 can be formed where a first portion of sealing element 514 contacts baseplate 512 (e.g., an upward facing portion of sealing element 514 that contacts a downward-facing portion of the baseplate 512), and a second (e.g, inner) contact seal 517 can be formed where a second portion of sealing element 514 contacts the substrate support 508 (e.g., a downward facing portion of sealing element 514 that contact an upward-facing portion of the substrate support 508). Such an embodiment can be possible where a sealing element has a "floating" attachment between both the baseplate and the substrate support. A "floating" attachment can be implemented between other components, such as between contact ring 510 and support portion 509 of the substrate support 508.

The sealing element 514 can have different cross-sectional widths (i.e., the distance from the inner radial edge to outer radial edge of the sealing element 514) to advantageously seal gaps (e.g. gap 516) of various configurations. In some embodiments, the sealing element 514 can have a cross-sectional width of 32 mm. In some embodiments, the sealing element 514 can have a cross-sectional width between 30 mm to 34 mm. In some embodiments, the sealing element 514 can have a cross-sectional width between about 26 mm to about 38 mm. In some embodiments, the sealing element 514 can have a cross-sectional width between about 20 mm to about 40 mm. In some embodiments, the sealing element 514 can have a cross-sectional width between about 40 mm to about 50 mm. In some embodiments, the sealing element 514 can have a cross-sectional width between about 1 mm to about 26 mm. In some embodiments, the sealing element 514 can have a cross-sectional width between about 10 mm to about 26 mm. In some embodiments, the sealing element 514 can have a cross-sectional width between about 15 mm to about 26 mm. In some embodiments, the sealing element 514 can have a cross-sectional width between about 20 mm to about 26 mm. The width of the sealing element can be selected based upon the inner and outer diameter value and the amount of stiffness the sealing element must have to counter the pressure differentials from the process space and the lower chamber.

In some embodiments, the substrate support 508 or contact ring 510 (or intervening component) can be configured to form a pocket 519. The pocket 519 can comprise a substantially L-shaped space on the substrate support 508 or contact ring 510. The pocket 519 can constrain the sealing elements 514 in the radial direction. The pocket 519 can prevent the sealing elements 514 from migrating laterally in a radial direction. The pocket 519 is not limited to an L-shape, and can be configured in any way to prevent said migration of the sealing element(s) 514 when the sealing element or elements 514 sit on the substrate support 508 or contact ring 510. In some embodiments, the pocket 519 can be about 3 mm tall. In some embodiments, the pocket can be about 0.1 mm to about 3 mm tall. In some embodiments, the pocket can be about 3 mm to about 5 mm tall. In some embodiments, the pocket can be about 5 mm to about 7 mm tall. In some embodiments, the pocket can be about 7 mm to about 10 mm tall.

In operation, the substrate support 508 moves (e.g., raises up) to the position shown in FIG. 8A. The apparatus 600 can be configured such that the substrate support raises up to the point where the one or more contact seals are formed. As described above, the apparatus 600 can move further past the point where the one or more contact seals are formed, to overdrive and create a bias between the components, thereby deflecting the sealing element 514. The amount of deflection and overdrive affects the contact forces and bias at the contact seals. Advantageously, the increased contact forces created by increased overdrive can allow the sealing element 514 to withstand increase process forces acting in the opposite direction. Specifically, the increased contact forces created by increased overdrive can counteract forces created, for example, by an increased pressure differential due to a higher pressure in the reactor chamber 502 and a lower pressure in the loading chamber 501 during operation. Thus, increased overdrive can provide for a seal which is capable of withstanding a larger pressure differential created by a higher pressure in the reactor chamber 502. Without overdrive, the outer contact seal 518 between the sealing element 514 and the baseplate 512 can become compromised under operation due to a higher reactor chamber 502 pressure, allowing gasses to flow from the reactor chamber 501 to the loading chamber 502.

The amount of overdrive can affect the allowable pressure differential in a process, but can also affect the flatness, compliance and uniformity of the sealing element. For example, the amount of overdrive is limited by the mechanical properties of the sealing element 514. If there is too much overdrive, the sealing element 514 can yield and/or deform to a point causing it to lose its loading or sealing capabilities. For example, the sealing element 514 can deform to a point it is no longer flat enough to form a sufficient seal. However, if there is too little overdrive, increased pressure differentials can cause a loss in sealing, in turn causing contamination or other problems. Thus, an increased overdrive and bias at the contact seal(s), with sufficient flexibility in the sealing elements to form a seal, while avoiding over excessive deflection that causes a loss in flatness and reduced sealing performance, are all factors to consider. Some of these factors can be mediated, for example, by increasing the thickness of a single sealing element. However a thicker, single sealing element may have reduced flexibility for any given overdrive and bias, which can adversely affect sealing.

In some embodiments, multiple sealing elements can be implemented to address and balance the above factors. Using multiple (e.g. stacked) sealing elements can increase sealing performance, to allow for greater (but not excessive) overdrive, while providing flexibility at the contact seal(s) and increased bias, and thus allowing for processing with greater pressure differentials. If there are multiple sealing elements 514, then each sealing element 514 will be affected by the overdrive causing a contact force on either the next sealing element 514, the baseplate 512, or the substrate support 508. These contact forces from each sealing element 514 combine together to form a larger bias between the contact seal 518 between the sealing elements 514 and the baseplate 512, and/or between the contact seal 517 between the sealing elements 514 and the substrate support 508. Thus, by utilizing multiple layers of sealing elements 514, it is possible to increase the amount of bias between the sealing elements 514 and seal(s) 517, 518 for any corresponding amount of overdrive. Thus, advantageously, in some embodiments, the apparatus 600 can utilize multiple sealing elements 514 in order to withstand higher operating pressure differentials.

FIG. 8B is a cross-sectional view of an embodiment of a semiconductor processing apparatus 600 comprising three sealing elements 514. In some embodiments, the apparatus 600 can comprise two or more sealing elements 514. In some embodiments comprising two or more sealing elements 514, the sealing elements 514 can be stacked on top of each other. The sealing elements can be positioned in a stacked configuration such that each sealing element directly contacts an adjacent corresponding sealing element. The sealing elements 514 can be aligned as shown, or can include some portion (such as an outer edge) that is offset with respect to a corresponding portion of an adjacent element. In some embodiments, all of the sealing elements 514 can be supported by and move with the substrate support 508. The sealing elements 514 can be overdriven by the substrate support 508. Embodiments of apparatus 600 with multiple sealing elements 514 can provide for larger bias at the outer contact seal 518 between the sealing elements 514 and the baseplate 512 relative to a chamber with only one, similarly configured sealing element. Such embodiments can advantageously provide a seal between the baseplate and the susceptor support that is capable of withstanding larger pressure differentials caused by a higher reactor chamber 502 pressure relative to a chamber with only one, similarly configured sealing element.

In some embodiments the sealing elements 514 can comprise holes, slits, or other apertures. The holes, slits, or other apertures can allow air or gasses to communicate between chambers. In some embodiments, the holes, slits, or other apertures can be used to flow purge gasses from the loading chamber 501 through the reactor chamber 502 and out of the exhaust port 507. The holes, slits, or other apertures can be used to purge the reactor chamber 502. In some embodiments the sealing elements 514 can be made from titanium. In some embodiments the sealing elements 514 can be made from Nimonic-90. In some embodiments, the sealing elements 514 can include no additional apertures, other than the single aperture forming the annular shape.

In some embodiments, the apparatus 600 can comprise between 2 to 7, or between 2 to 5, or between 2 to 3 stacked sealing elements 514. In some embodiments, the apparatus 600 can comprise 2 to 10 stacked sealing elements 514. In some embodiments, the apparatus 600 can comprise 2 to 15 stacked sealing elements The amount of overdrive suitable to provide advantageous sealing while compensating for other of the above factors may vary. In some embodiments, the amount of overdrive may be about 1.5 mm. In some embodiments, the amount of overdrive may be less than or equal to 1.5 mm, for example, between about 0.1 mm and about 1.5 mm. In some embodiments, the amount of overdrive may be from about 0.1 mm to about 6 mm. In some embodiments, the amount of overdrive may be less than or equal to about 4 mm, for example, between about 0.1 mm to about 3 mm. In some embodiments, the amount of overdrive may be greater than or equal to about 1.0 mm, for example, between about 1.0 mm and 6 mm. In some embodiments, the amount of overdrive may be between, about 3 mm to about 6 mm. In some embodiments, the amount of overdrive may be from about 1 mm to about 3 mm. In some embodiments, the amount of overdrive may be from about 1 mm to about 2 mm. In some embodiments, the amount of overdrive may be between about 0.1 mm and about 3.5 mm, for example, between about 3 mm to about 3.5 mm. In some embodiments, the amount of overdrive may be from about 1 mm to about 5 mm, including about 4 mm to about 5 mm.

The thickness of the sealing element(s) to provide advantageous sealing while compensating for other of the above factors may vary. The sealing element 514 can comprise a formed metal sheet with a thickness between about 0.1 mm and about 3 mm. In some embodiments, the sealing element 514 can comprise a thickness of between about 0.4 mm and about 3 mm, or between about 0.4 mm and about 2 mm. In some embodiments, the sealing element 514 can comprise a thickness of between about 0.1 m and about 1 mm. In some embodiments, the sealing element 514 can comprise a thickness of about 1.5 mm. In some embodiments, the sealing element 514 can comprise a thickness of about 0.4 mm.

The amount of processing pressure differential at which one or more sealing element(s) can provide advantageous sealing, while compensating for other of the above factors may vary. In some embodiments, a single sealing element may advantageously seal at a process pressure differential of 15 Torr or less. In some embodiments, a stacked sealing element configuration (with two or more sealing elements 514) may be capable of substantially maintaining a seal at a pressure differential between 0.1 Torr to 60 Torr. In some embodiments, a stacked sealing element 514 configuration may be capable of substantially maintaining a seal at pressure differences of greater than 15 Torr, or greater than 20 Torr, 25 Torr, 30 Torr, 35 Torr, 40 Torr, 45 Torr, 50 Torr, or 55 Torr. In some embodiments, a stacked sealing element 514 configuration may be capable of substantially maintaining a seal at pressure differences of between 15-20 Torr. In some embodiments, the stacked sealing element 514 configuration may be capable of substantially maintaining a seal at pressure differences of 0.1 Torr to 40 Torr. In some embodiments, the stacked sealing element 514 may be capable of substantially maintaining a seal at pressure differences of 0.1 Torr to 30 Torr. In some embodiments, the sealing element 514 (alone or in a stacked configuration) may be capable of substantially maintaining a seal at pressure differences of 0.1 Torr to 15 Torr.

The amount of bias force loaded between the baseplate or susceptor support and the sealing element at which one or more sealing element(s) can provide advantageous sealing, while compensating for other of the above factors may vary. In some embodiments, each sealing element 514 may be loaded with force which acts on the baseplate or another sealing element 514 due to overdrive. In some embodiments, each sealing element 514 may be loaded with 10N to 400N of force due to overdrive. In some embodiments, each sealing element 514 may be loaded with 35N to 360N of force due to overdrive. In some embodiments, each sealing element 514 may be loaded with 35N to 460N of force due to overdrive. In some embodiments, each sealing element 514 may be loaded with 110N to 135N of force due to overdrive. In some embodiments, each sealing element 514 may be loaded with 150N to 200N of force due to overdrive. In some embodiments, each sealing element 514 may be loaded with 200N to 400N of force due to overdrive.

The foregoing description details some embodiments of the invention. It will be appreciated, however, that no matter how detailed the foregoing appears in text, the invention can be practiced in many ways. As is also stated above, it should be noted that the use of particular terminology when describing certain features or aspects of the invention should not be taken to imply that the terminology is being re-defined herein to be restricted to including any specific characteristics of the features or aspects of the invention with which that terminology is associated. The scope of the invention should therefore be construed in accordance with the appended claims and any equivalents thereof.

What is claimed is:

1. A semiconductor processing apparatus comprising:
a reaction chamber comprising a baseplate including an opening;
a moveable substrate support configured to support a substrate and configured to move towards the opening of the baseplate; and
a metal annular sealing ring extending around the substrate support and configured to form a seal between the baseplate and the substrate support, wherein a plurality of apertures extend through the sealing ring, the apertures configured to provide a flow path between a position below the sealing ring to a position above the sealing ring;
wherein the baseplate comprises a surface, the surface including an apex, the seal formed between the apex and the sealing ring, wherein the apertures extend radially across the apex.

2. The apparatus of claim 1, wherein the seal comprises a metal to metal contact between the sealing ring and at least one of the baseplate and the substrate support.

3. The apparatus of claim 1, wherein the sealing ring comprises a flexible diaphragm comprising at least one of an austenitic nickel-chromium-molybdenum-tungsten alloy, a nickel-chromium-cobalt alloy comprising more than 50% nickel and 20% chromium, or Grade 2 titanium.

4. The apparatus of claim 1, further comprising an exhaust port, wherein at least one of the apertures and the seal is positioned at a radial distance that is less than or equal to the exhaust port, relative to a center of the substrate support.

5. The apparatus of claim 4, further comprising a gap extending radially between the substrate support and the baseplate, wherein the apertures are arranged at a greater radial distance from the center of the substrate support than the gap.

6. The apparatus of claim 5, wherein the seal is formed without a substantial vertical gap between the substrate support and the baseplate.

7. The apparatus of claim 1, wherein each aperture comprises a slot.

8. The apparatus of claim 1, wherein the apertures are configured to allow about 50 sccm to about 200 sccm of flow through the sealing ring when the seal is formed between the baseplate and the substrate support.

9. The apparatus of claim 1, wherein the substrate support comprises an upper portion and a lower portion, wherein the sealing ring is affixed to an underside of the upper portion of the substrate support.

10. The apparatus of claim 1, wherein the total circumference where the surface contacts the sealing ring is greater than the total circumference of the apertures.

11. The apparatus of claim 1, wherein the sealing ring comprises a first sealing ring, further comprising a second sealing ring stacked with the first sealing ring.

12. The apparatus of claim 1, wherein a first portion of the sealing ring forms a first contact seal with the baseplate, and a second portion of the sealing ring forms a second contact seal with the substrate support.

13. A semiconductor processing apparatus comprising:
a reaction chamber comprising a baseplate including an opening;
a moveable substrate support configured to support a substrate and configured to move towards the opening of the baseplate; and
two or more stacked metal sealing rings extending around the substrate support, at least one of the metal sealing rings configured to form a seal between the baseplate and the substrate support;
wherein a plurality of apertures extend through the sealing rings, the apertures configured to provide a flow path between a position below the sealing rings to a position above the sealing rings; and
wherein the baseplate comprises a surface, the surface including an apex, the seal formed between the apex and the sealing ring, wherein the apertures extend radially across the apex.

14. The semiconductor processing apparatus of claim 13, wherein the two or more metal sealing rings comprises three or more sealing rings.

15. The semiconductor processing apparatus of claim 13, wherein the two or more sealing rings are substantially aligned with respect to each other.

16. The semiconductor processing apparatus of claim 13, wherein each of the sealing rings directly contacts an adjacent corresponding sealing ring.

17. The semiconductor processing apparatus of claim 13, wherein a portion of a first sealing ring of the two or more sealing rings forms a first contact seal with the baseplate, and a portion of a second sealing ring of the two or more sealing rings forms a second contact seal with the substrate support.

18. The semiconductor processing apparatus of claim 17, wherein the two or more sealing rings are attached to at least one of the baseplate and the substrate support with a floating attachment.

19. The semiconductor processing apparatus of claim 18, wherein the two or more sealing rings are attached to both the baseplate and the substrate support with a floating attachment.

20. The apparatus of claim 18, further comprising a contact ring, wherein the floating attachment is provided by the contact ring.

21. The semiconductor processing apparatus of claim 17, wherein the first contact seal is an outer contact seal, and the second contact seal is an inner contact seal.

22. The semiconductor processing apparatus of claim 21, wherein the first contact seal is an upward facing seal, and the second contact seal is a downward facing seal.

23. The semiconductor processing apparatus of claim 13, wherein the two or more sealing rings are configured to seal at a pressure differential between about 0.1 to about 60 Torr.

24. The semiconductor processing apparatus of claim 23, wherein the two or more sealing rings are configured to seal at a pressure differential greater than about 15 Torr.

25. The semiconductor processing apparatus of claim 13, wherein the substrate support is positioned relative to the baseplate to provide an overdrive of between about 1 mm to about 5 mm.

26. The semiconductor processing apparatus of claim 13, wherein each of the stacked sealing rings comprises a flexible diaphragm comprising at least one of an austenitic nickel-chromium-molybdenum-tungsten alloy, a nickel-chromium-cobalt alloy comprising more than 50% nickel and 20% chromium, or Grade 2 titanium.

27. The semiconductor processing apparatus of claim 13, wherein each of the stacked sealing rings are about 0.4 mm to about 3 mm thick.

28. The apparatus of claim 13, wherein the sealing ring is pneumatically actuated.

\* \* \* \* \*